United States Patent
Ohmori

(10) Patent No.: US 7,327,581 B2
(45) Date of Patent: Feb. 5, 2008

(54) CIRCUIT DEVICE

(75) Inventor: Mutsuhiro Ohmori, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/593,602

(22) Filed: Nov. 7, 2006

(65) Prior Publication Data

US 2007/0103878 A1    May 10, 2007

(30) Foreign Application Priority Data

Nov. 7, 2005  (JP)  ............................ P2005-322206

(51) Int. Cl.
    *H05K 7/00*    (2006.01)
(52) U.S. Cl. .................. 361/760; 361/788; 361/796; 361/797; 361/798; 361/799; 710/300; 710/305; 710/10; 257/675; 257/691; 257/700; 257/724; 365/51; 365/205
(58) Field of Classification Search .............. 361/717, 361/760, 788, 796–799; 365/51, 205, 230.03; 257/675, 691, 700, 706, 723, 724, 737, 777, 257/783; 705/67; 438/107; 708/207; 710/10, 710/300, 305
    See application file for complete search history.

(56) References Cited

U.S. PATENT DOCUMENTS

| | | | | | |
|---|---|---|---|---|---|
| 4,876,681 | A | * | 10/1989 | Hagiwara et al. | ............ 370/408 |
| 5,198,965 | A | * | 3/1993 | Curtis et al. | ................ 361/717 |
| 5,260,611 | A | * | 11/1993 | Cliff et al. | ..................... 326/39 |
| 5,414,253 | A | * | 5/1995 | Baudouin et al. | ........... 235/492 |
| 5,485,103 | A | * | 1/1996 | Pedersen et al. | .............. 326/41 |
| 5,724,555 | A | * | 3/1998 | Wadsworth | .................. 358/468 |
| 6,018,787 | A | * | 1/2000 | Ip | .............................. 711/100 |
| 6,236,299 | B1 | | 5/2001 | Yu | |
| 6,396,137 | B1 | * | 5/2002 | Klughart | ..................... 257/691 |
| 6,445,977 | B1 | * | 9/2002 | Hwang et al. | ............. 700/228 |
| 6,492,727 | B2 | * | 12/2002 | Nishizawa et al. | ......... 257/723 |
| 6,571,128 | B2 | * | 5/2003 | Lebel et al. | .................. 607/60 |
| 6,574,454 | B1 | * | 6/2003 | Tuttle | ........................ 455/41.1 |
| 6,802,961 | B2 | * | 10/2004 | Jackson | ....................... 210/86 |
| 6,882,592 | B2 | * | 4/2005 | Noguchi et al. | ....... 365/230.03 |
| 7,072,922 | B2 | * | 7/2006 | Andreev et al. | ............ 708/207 |
| 2002/0043717 | A1 | * | 4/2002 | Ishida et al. | ................ 257/723 |
| 2002/0103765 | A1 | * | 8/2002 | Ohmori | ........................ 705/67 |
| 2004/0245617 | A1 | * | 12/2004 | Damberg et al. | ........... 257/686 |
| 2004/0251536 | A1 | * | 12/2004 | Hatada et al. | .............. 257/700 |
| 2005/0024974 | A1 | * | 2/2005 | Noguchi et al. | ....... 365/230.03 |

* cited by examiner

*Primary Examiner*—Tuan T. Dinh
*Assistant Examiner*—Xiaoliang Chen
(74) *Attorney, Agent, or Firm*—Rader Fishman & Grauer PLLC; Ronald P. Kananen

(57) ABSTRACT

A circuit device includes plural semiconductor circuit devices that are formed on independent substrates, respectively, and communicate with each other. Each of the semiconductor circuit devices includes: plural modules of an identical type, functions of which are substitutable for one another; a module selecting unit that selects, among the plural modules, usable modules that are a part of the plural modules; and a circuit block including an interface unit for the modules selected by the module selecting unit to exchange signals with the other semiconductor circuit devices. A logic module included in one of the semiconductor circuit devices belongs to a different type, a function of which is not substitutable for a function of a logic module included in at least one of the other semiconductor circuit devices.

13 Claims, 16 Drawing Sheets

PERIPHERAL CHIP (3-13)

BACK PLANE CHIP (3-14 TO 3-16)

CIRCUIT DEVICE

CROSS-REFERENCES TO RELATED APPLICATIONS

This application contains subject matter related to Japanese Patent Application JP 2005-322206 filed in the Japanese Patent Office on Nov. 7, 2005, the entire contents of which being incorporated herein by reference.

BACKGROUND OF THE INVENTION

1. Field of the Invention

The present invention relates to a circuit device that has plural semiconductor circuit devices formed on independent substrates, respectively, and, more particularly to a circuit device, improvement of yield of which is realized.

2. Description of the Related Art

In recent years, advances in communication and storage devices are more remarkable than advances in semiconductors. According to the "Gilder's Law" proposed by George Gilder, a band width in communication increases at speed at least three times as high as an increase in an ability of computers. A capacity of an external storage increases at speed exceeding the "Moore's Law".

On the other hand, the semiconductor manufacturing technique is becoming complicated year after year. For example, a phase shift mask method for correcting a limit of optical lithography, an immersion photoexposure device that immerses a semiconductor substrate in a liquid to process the semiconductor substrate, and the like have been introduced. Cost and time for creating masks have been exponentially increasing.

Whereas a circuit size formed on one semiconductor chip increases, circuit design becomes more and more difficult because of an increase in crosstalk between wirings. Thus, a design man-hour is steadily increasing. It is becoming difficult to entirely design one semiconductor chip from the beginning and it is becoming essential to reuse design resources.

In order to cope with the complication of the semiconductor manufacturing technique and the increase in a design man-hour, a semiconductor integrated circuit of a new structure called a Structured ASIC has been proposed. In the Structured ASIC, a circuit cell having a structure with rougher granularity than a basic gate such as a NAND circuit is used as a minimum unit of a circuit. Unlike an FPGA (field programmable gate array) and the like, a circuit having a desired function is formed by mask routing for customizing a part of wiring according to an application. Although the mask routing is inferior to a standard cell system in terms of an area, by using the mask routing, there is an advantage that waste is remarkably reduced compared with a reconfigurable wiring structure in the FPGA and it is possible to develop a semiconductor chip in a short time compared with the standard cell system.

As a representative thesis concerning a basic logical unit of the Structured ASIC, for example, there is "Regular logic fabrics for a via patterned gate array (VPGA), CMU K. Y. Tong, IBM R. Puri, IEEE 2003 Custom integrated circuits conference". In this thesis, a basic unit is constituted by using a three-input lookup table, a scan flip-flop, two three-input NAND circuits, and seven buffers. When a layout using the contents of this basic unit and a layout by the standard cell system are compared, although an area in the former layout is larger than the latter layout by 40% to 68%, delays are substantially the same. In the U.S. Pat. No. 6,236,229, a logic cell in which a NAND circuit is connected to an input of a lookup table is proposed.

In order to realize reuse of design resources, it is a general practice to organize design data of functional blocks into a library as IPs (Intellectual Properties). Examples of means for connecting IP cores in a chip include an AXI bus proposed by ARM Limited in the United States and an OCP (Open Core Protocol) that is an on-chip bus protocol. In these buses, it is possible to feed different data flows and hang plural masters from an identical bus. Consequently, a mechanism for connecting a group of IP cores, which perform plural functions, to an identical bus and efficiently using the IP cores is proposed.

SUMMARY OF THE INVENTION

However, in the semiconductor integrated circuit in recent years, since refining of a machining dimension and an increase in a circuit size have been advanced, a fall in yield due to defects is becoming serious. It is possible to realize efficiency of a manufacturing process and a reduction in a design period through the introduction of the Structured ASIC and the efficient use of the IP cores. Nevertheless, these is no means for solving the fall in yield due to the refining of a machining dimension.

Thus, it is desirable to provide a circuit device that realizes improvement of the fall in yield due to defects.

According to an embodiment of the invention, a circuit device includes plural semiconductor circuit devices that are formed on independent substrates, respectively, and communicate with each other. Each of the semiconductor circuit devices includes: plural modules of an identical type, functions of which are substitutable for one another; a module selecting unit that selects, among the plural modules, usable modules that are a part of the plural modules; and a circuit block including an interface unit for the modules selected by the module selecting unit to exchange signals with the other semiconductor circuit devices. A logic module included in one of the semiconductor circuit devices belongs to a different type, a function of which is not substitutable for a function of a logic module included in at least one of the other semiconductor circuit devices.

In the circuit device, plural kinds of modules, functions of which are not substitutable for one another, are included in all the plural semiconductor circuit devices formed on independent substrates, respectively, and modules of an identical type are included in semiconductor circuit devices on an identical substrate. The plural semiconductor circuit devices communicate with each other to realize operations of all the devices.

In the circuit device, among the plural modules included in the semiconductor circuit devices on an identical substrate, usable modules, which are apart of the plural modules, selected by the module selecting unit exchange signals with the semiconductor circuit devices on the other substrates through the interface unit.

Preferably, the circuit block includes plural input/output units, each of which outputs at least one signal to one module and/or inputs at least one signal generated in the one module. The module selecting unit selects a part of the plural modules according to a control signal inputted, connects the modules selected and the plural input/output units in a one to one relation, and connects one module selected out of at least two modules according to the control signal to each of the plural input/output units.

For example, when the plural modules include N (N indicates an integer equal to or larger than 3) modules from a first module to an Nth module and the plural input/output units include (N−1) input/output units from a first input/output unit to an (N−1)th input/output unit, the module selecting unit may select one of an i-th module (i indicates integers from 1 to (N−1)) and an (i+1)th module and connects the module selected to an i-th input/output unit.

Preferably, the circuit device includes a signal transmitting unit that is capable of transmitting signals among the semiconductor circuit devices at speed equivalent to or higher than transmission speed of signals among the modules in the semiconductor circuit device.

The signal transmitting unit may transmit at least a part of signals using light. In this case, the interface unit may convert at least a part of electric signals outputted to the signal transmitting unit into a light signal and convert at least a part of light signals inputted from the signal transmitting unit into an electric signal.

The signal transmitting unit may include an electrode that pierces through the substrate and may include wiring formed by wire bonding.

Two or more interface units included in different semiconductor circuit devices may perform radio communication using radio waves.

Preferably, plural interface units included in the plural semiconductor circuit devices perform communication according to a common communication system.

DESCRIPTION OF THE PREFERRED EMBODIMENTS

Figure 1:
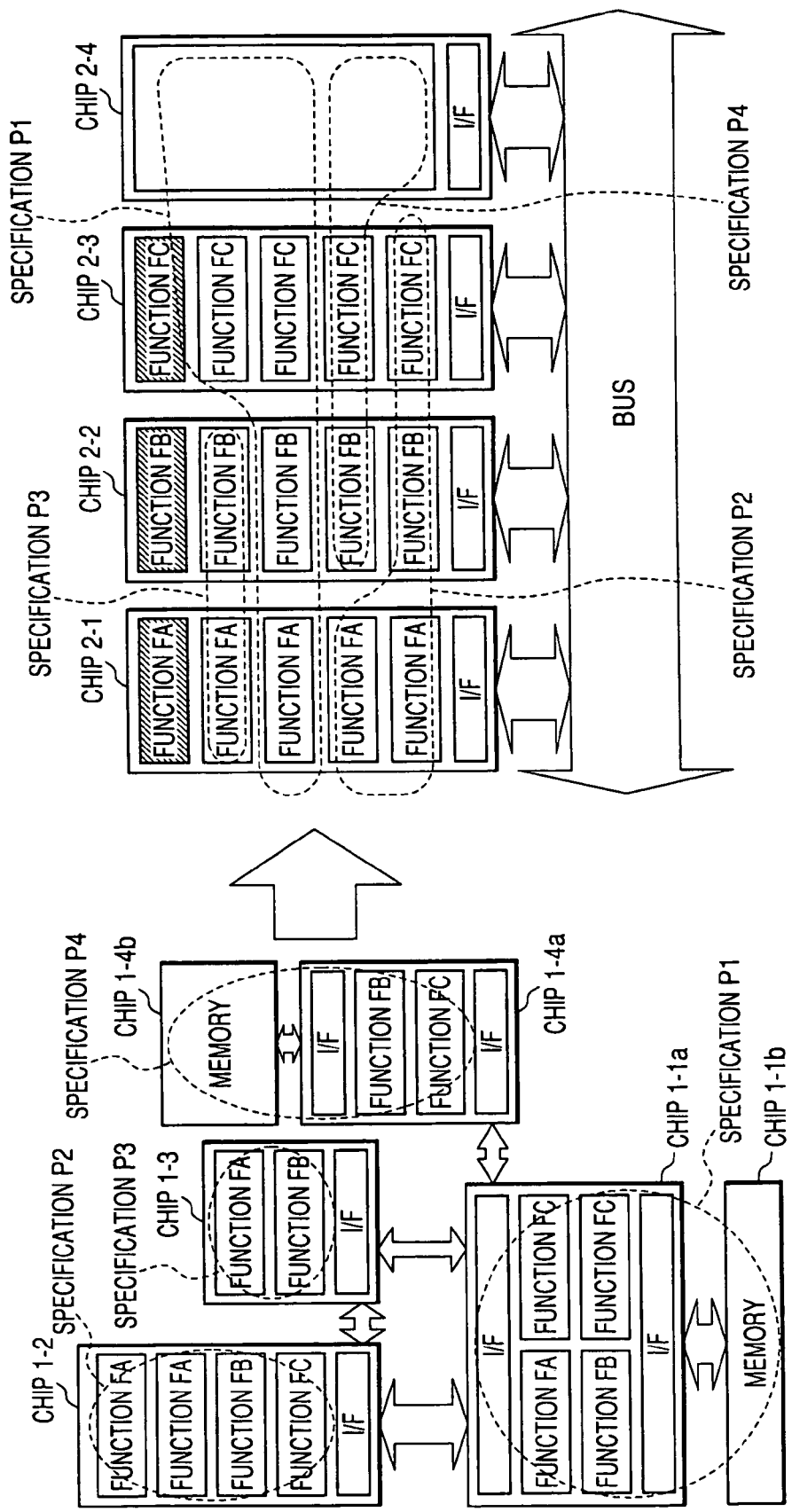
FIG. 1 is a diagram showing an example of a schematic structure of a circuit device according to an embodiment of the invention.

FIG. 1 is a diagram showing an example of a schematic structure of a circuit device according to an embodiment of the invention.

In FIG. 1, a general circuit device in the past is shown on the left side of an arrow and the circuit device according to this embodiment is shown on the right side of the arrow.

The circuit device shown on the left side includes six semiconductor chips (1-1a, 1-1b, 1-2, 1-3, 1-4a, and 1-4b).

The semiconductor chip (hereinafter abbreviated as "chip") 1-1a is mounted with one module with a function FA, one module with a function FB, and two modules with a function FC and realizes a specification P1. The chip 1-1b has a memory function and is connected to the chip 1-1a. The chip 1-2 is mounted with two blocks with the function FA, one block with the function FB, and one block with the function FC and realizes a specification P2. The chip 1-3 is mounted with one block with the function FA and one block with the function FB and realizes a specification P3. The chip 1-4a is mounted with one block with the function FB and one block with the function FC and realizes a specification P4. The chip 1-4b has a memory function and is connected to the chip 1-4a.

These chips include interface units, respectively, and exchange necessary signals with one another via buses. The buses that connect the respective chips are constituted by different specifications, respectively.

On the other hand, the circuit device according to this embodiment shown on the right side includes four chips (2-1 to 2-4) and realizes the same specifications as the circuit device shown on the left side. These chips have a redundant remedial function for replacing a defective module with a normal module to remedy a defect.

The chip 2-1 includes five modules with the function FA, the chip 2-2 includes five modules with the function FB, and the chip 2-3 includes five modules with the function FC. In other words, the chips 2-1 to 2-3 include plural modules of an identical type, functions of which are substitutable for one another, respectively. The modules of the identical type are collected on an identical chip.

The number of modules of the identical type mounted on each of these chips is larger than the number necessary in the entire device by one. In other words, a redundant module is included in the modules of the identical types mounted on each of the chips. The chips 2-1 to 2-3 have a function of replacing a defective module with the redundant module to thereby remedy a defect of the defective module (a redundant remedial function).

The chip 2-4 has a memory function necessary in the entire device. The chip 2-4 includes a redundant memory cell and has a redundant remedial function for replacing a defective memory cell with a normal memory cell.

These chips 2-1 to 2-4 have interface circuits that perform communication according to a common communication system, respectively, and exchange signals via a common bus. The modules mounted on the respective chips exchange signals via the bus, whereby the specifications P1 to P4, which are the same as those of the circuit device on the left side of the figure, are realized. The specification P1 is realized by one module (the function FA) of the chip 2-1, one module (the function FB) of the chip 2-2, one module (the function FC) of the chip 2-3, and the memory function of the chip 2-4. The specification P2 is realized by two modules (the function FA) of the chip 2-1, one module (the function FB) of the chip 2-2, and one module (the function FC) of the chip 2-3. The specification P3 is realized by the function FA of the chip 2-1 and the function FB of the chip 2-2. The specification P4 is realized by the function FB of the chip 2-2, the function FC of the chip 2-3, and the memory function of the chip 2-4.

Figure 2:
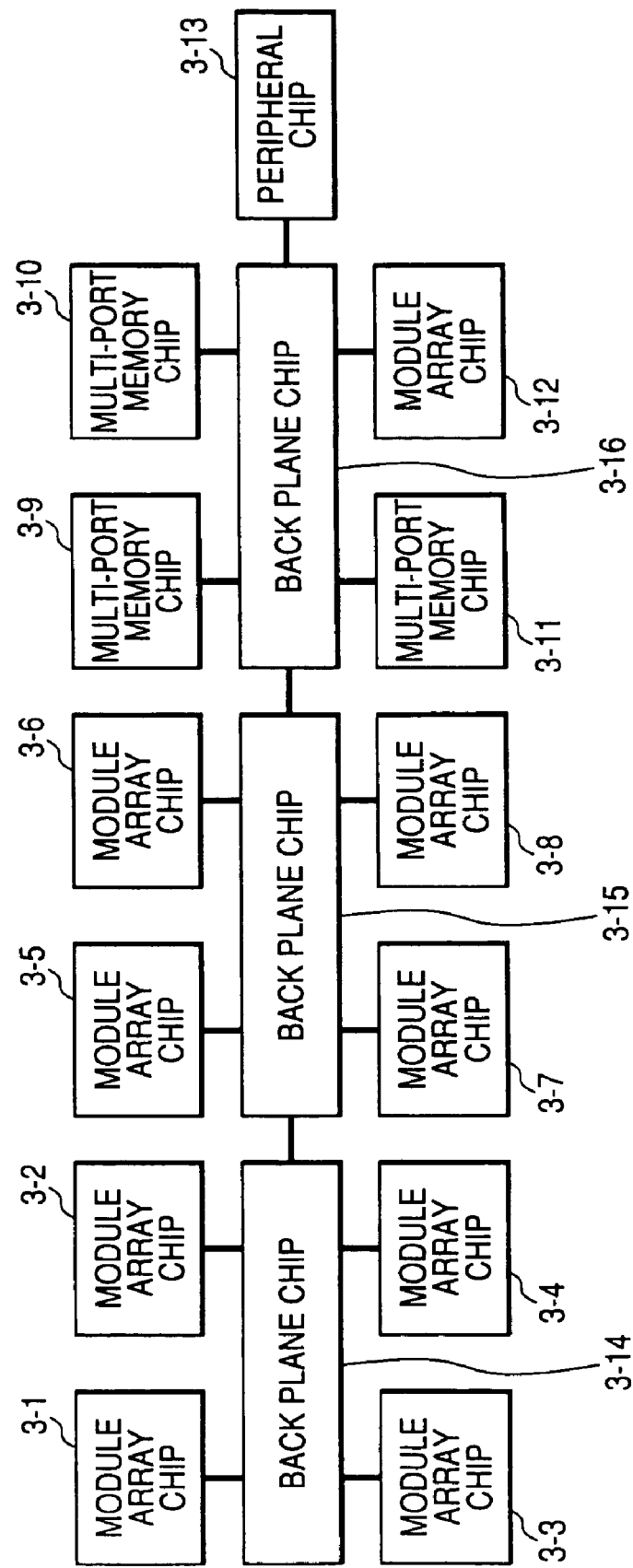
FIG. 2 is a diagram showing an example of a more specific structure of the circuit device according to the embodiment.

FIG. 2 is a diagram showing an example of a specific structure of the circuit device according to this embodiment.

The circuit device shown in FIG. 2 includes module array chips 3-1 to 3-8 that includes plural modules, multi-port memory chips 3-9 to 3-12, a peripheral chip 3-13, and back plane chips 3-14 to 3-16.

The back plane chips 3-14, 3-15, and 3-16 are connected in cascade.

The module array chips 3-1 to 3-4 are connected to the back plane chip 3-14. The module array chips 3-5 to 3-8 are connected to the back plane chip 3-15. The multi-port memory chips 3-9 to 3-12 and the peripheral chip 3-13 are connected to the back plane chip 3-16.

The respective chips perform optical communication via an optical fiber or the like. The module array chips, the multi-port memory chips, and the peripheral chip (3-1 to 3-13) perform communication with one another via the back plane chips (3-14 to 3-16) connected in cascade.

Figure 3:
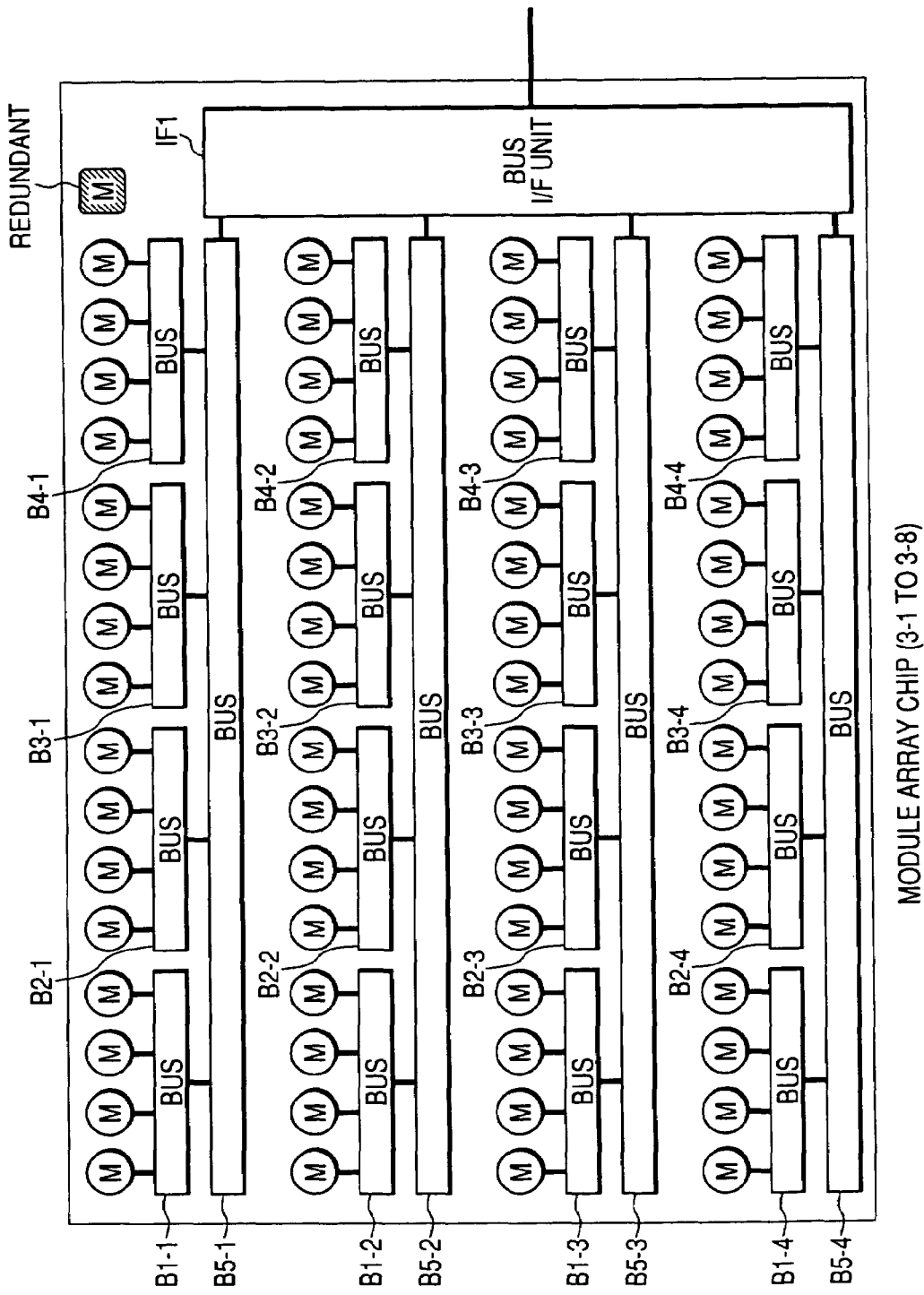
FIG. 3 is a diagram showing an example of a structure of a module array chip.

FIG. 3 is a diagram showing an example of a structure of each of the module array chips (3-1 to 3-8).

The module array chip shown in FIG. 3 includes sixty-five modules M, functions of which are substitutable for one another, buses B1-1 to B1-4, B2-1 to B2-4, B3-1 to B3-4, B4-1 to B4-4, and B5-1 to B5-4 connected in layers such as AXI buses, and a bus/interface unit IF1.

Four modules M are connected to a bus Bp-q (p and q indicate integers from 1 to 4, respectively). The bus Bp-q gives an access right to the respective four modules equally according to the round robin system or the like. The modules having the access right given become masters and issue requests for data transfer.

Four buses B1-$q$ to B4-$q$ are connected to a bus B5-$q$. Like the bus described above, the bus B5-$q$ gives an access right to the respective four buses equally according to the round robin system or the like. When the access right is given to any one of the buses B1-$q$ to B4-$q$ by the bus B5-$q$, modules connected to the bus having the access right given issues a data transfer request to other modules in the chip or to other chips via the bus B5-$q$.

Four buses B5-1 to B5-4 are connected to the bus/interface unit IF1. In the same manner as described above, the bus/interface unit IF1 gives an access right to the respective four buses equally according to the round robin system or the like. When the access right is given to any one of the buses B5-1 to B5-4 by the bus/interface unit IF1, modules connected to the bus having the access right given issues a data transfer request to the other modules in the chip or to other chips via the bus/interface unit IF1.

The bus/interface unit IF1 converts electric signals, which are outputted from the four buses B5-1 to B5-4 to the outside of the chip, into light signals, respectively. The bus/interface unit IF1 converts light signals, which are inputted from the outside of the chip to these buses, into electric signals, respectively. A section that performs the photoelectric conversion will be explained with reference to FIGS. 7 and 8 later.

The module array chip shown in FIG. 3 includes, as indicated by a shaded portion at a right corner of the figure, one redundant module not connected to the bus Bp-q. The module array chip selects usable sixty-four modules out of the sixty-five modules and connects the modules to the bus Bp-q. Therefore, when one defective module is included in the sixty-five modules, it is possible to replace the module with the redundant module.

Figure 4:
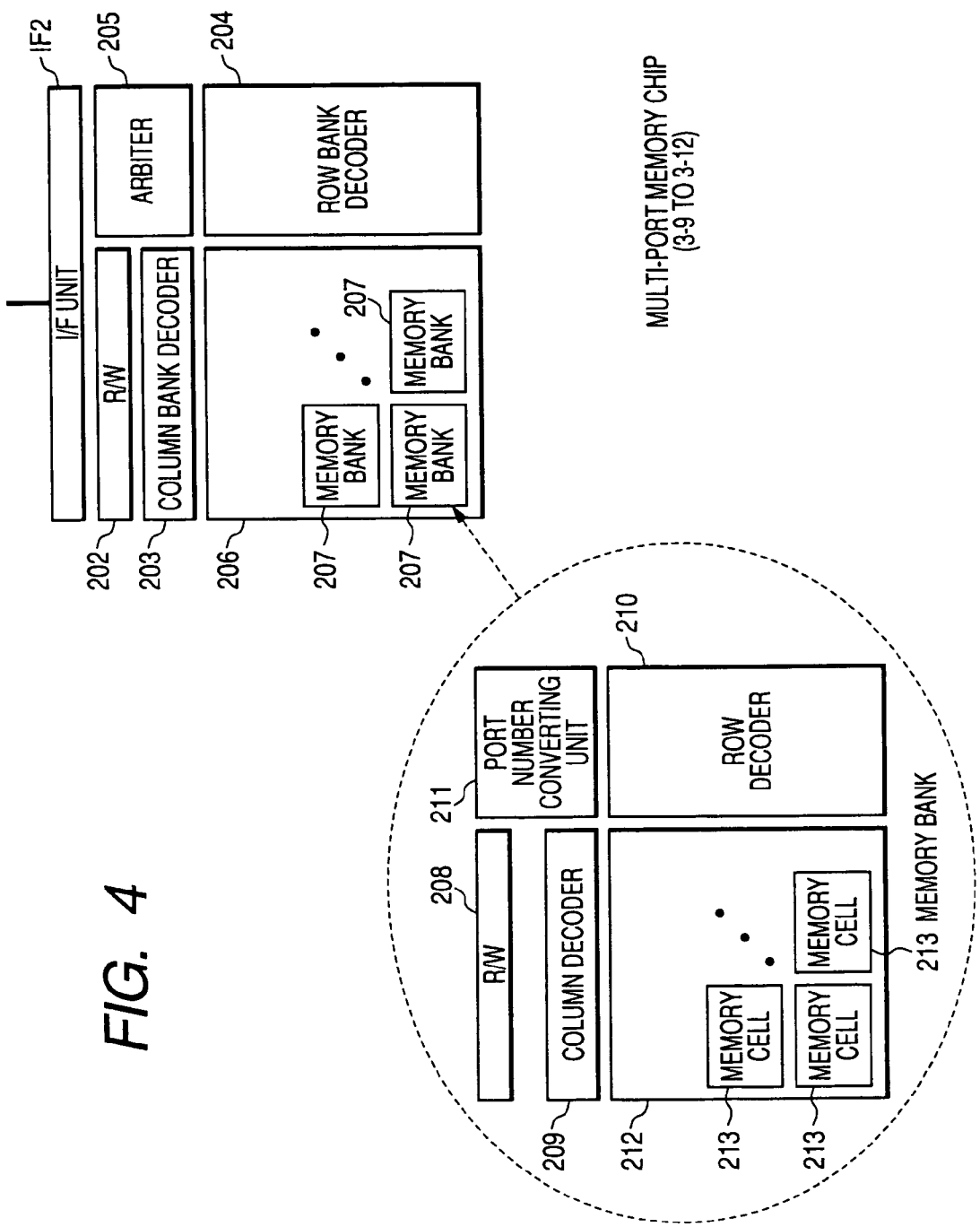
FIG. 4 is a diagram showing an example of a structure of a multi-port memory chip.

FIG. 4 is a diagram showing an example of a structure of each of the multi-port memory chips (3-9 to 3-12).

The multi-port memory chip shown in FIG. 4 includes an interface unit IF2, a read/write unit 202, a column bank decoder 203, a row bank decoder 204, an arbiter 205, and a memory bank array 206.

The memory bank array 206 includes plural memory banks 207 arranged in a matrix shape.

The interface unit IF2 converts an electric signal outputted to the outside of the chip into a light signal and converts a light signal inputted from the outside of the chip into an electric signal.

The read/write unit 202 reads out data from and writes data in the respective memory banks 207 included in the memory bank array 206.

The column bank decoder 203 generates, according to memory addresses of plural ports inputted via the interface unit IF2, address signals that designate columns at access destinations of the respective ports.

The row bank decoder 204 generates, according to memory addresses of plural ports inputted via the interface unit IF2, address signals that designate rows at access destinations of the respective ports.

The arbiter 205 controls the column bank decoder 203 and the row bank decoder 204 to prevent an identical memory bank 207 from being simultaneously accessed by plural ports.

Each of the memory banks 207 includes, for example, as shown in FIG. 4, a read/write unit 208, a column decoder 209, a row decoder 210, a port number converting unit 211, and a memory cell array 212.

The memory cell array 212 includes plural memory cells 213 arranged in a matrix shape.

The read/write unit 208 reads out data from and writes data in the respective memory cells 213 included in the memory cell array 212.

The port number converting unit 211 controls, according to address signals supplied from the column bank decoder 203 and the bank decoder 204, the read/write unit 208 to input and output data in a port allocated to the own memory bank among the plural ports. The port number converting unit 211 generates, according to these address signals, address signals that designate a column and a row of the memory cell array 212.

The column decoder 209 generates, according to the address signal for a column of the memory cell array 212 supplied from the port number converting unit 211, a signal for selecting a column to which a memory cell to be accessed belongs.

The row decoder 210 generates, according to the address signal for a column of the memory cell array 212 supplied from the port number converting unit 211, a signal for selecting a row to which a memory cell to be accessed belongs.

In the multi-port memory chip shown in FIG. 4, according to the memory addresses of the plural ports inputted via the interface unit IF2, the memory banks 207 at access destinations are allocated to the respective ports. In this case, arbitration is performed by the arbiter 205 to prevent an identical memory bank 207 from being accessed by plural ports. When the memory banks 207 are allocated to the respective ports one by one, data is written in and read out from the memory cells in the respective memory banks through the respective ports. It is possible to access the memory cells from the respective ports simultaneously in parallel.

Figure 5:
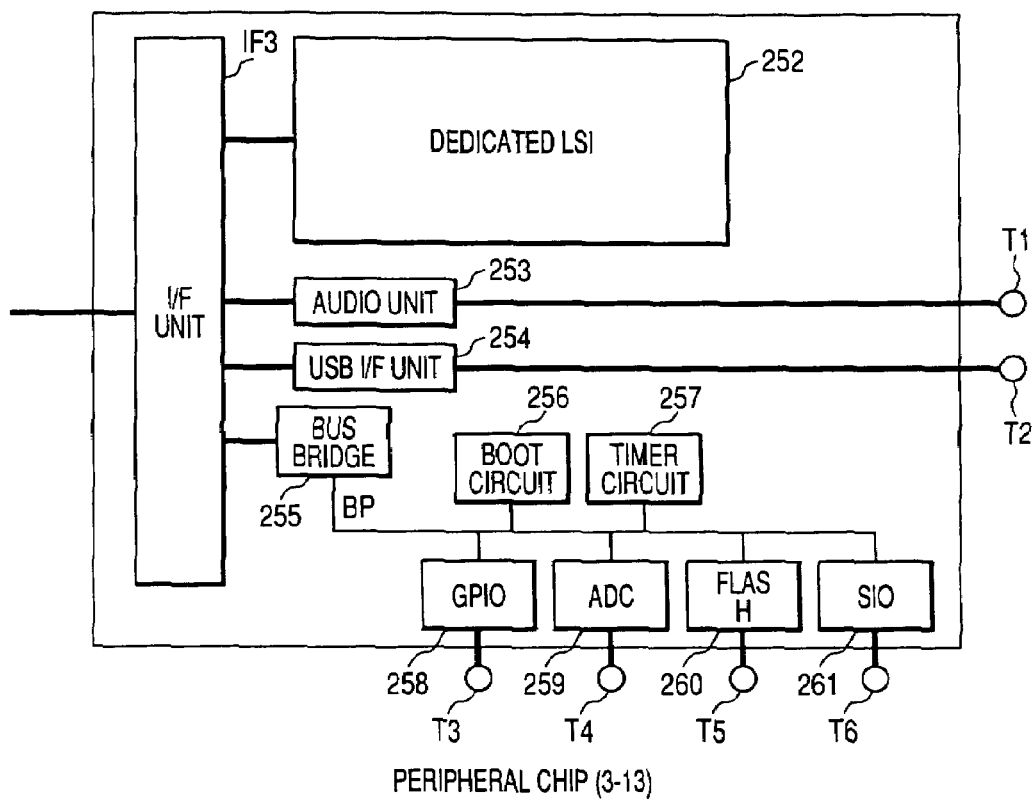
FIG. 5 is a diagram showing an example of a structure of a peripheral chip.

FIG. 5 is a diagram showing an example of a structure of the peripheral chip 3-13.

The peripheral chip 3-13 is a chip for realizing functions specialized for application fields that may not be covered by the module array chips 3-1 to 3-8. In the example in FIG. 5, the peripheral chip 3-13 includes an interface unit IF3, a dedicated LSI 252, an audio unit 253, a USB interface unit 254, a bus bridge 255, a boot circuit 256, a timer circuit 257, a parallel input/output circuit 258, an analog/digital conversion circuit 259, an external memory interface circuit 260, and a serial input/output circuit 261.

The interface unit IF3 converts an electric signal outputted to the outside of the chip into a light signal and converts a light signal inputted from the outside of the chip into an electric signal.

The dedicated LSI 252 is a circuit that realizes functions specialized for specific application fields. For example, like the module array chip explained above, the dedicated LSI 252 has a structure capable of performing redundant remedy.

The audio unit 252 reproduces an audio signal supplied via the interface unit IF3 and outputs the audio signal to a terminal T1.

The USB interface unit 254 performs communication based on a USB (universal serial bus) between the chip and a not-shown electronic device connected thereto via a terminal T2.

The bus bridge 255 performs control for making it possible to mutually transfer data between a main bus of a circuit device connected to the chip via the interface unit IF3 and a local bus BP such as an APB (advanced peripheral bus) used in the inside of the peripheral chip 3-13.

The boot circuit 256 performs control for starting the respective circuits of the circuit device when a power supply is turned on.

The timer circuit 257 manages a date and time.

The parallel input/output circuit 258 inputs and outputs a parallel signal.

The analog/digital conversion circuit 259 converts an analog signal inputted into a digital signal.

The external memory interface circuit 260 performs interface processing for making it possible to use a storage device such as a flash memory in the circuit device.

The serial input/output circuit 261 inputs and outputs a serial signal.

Figure 6:
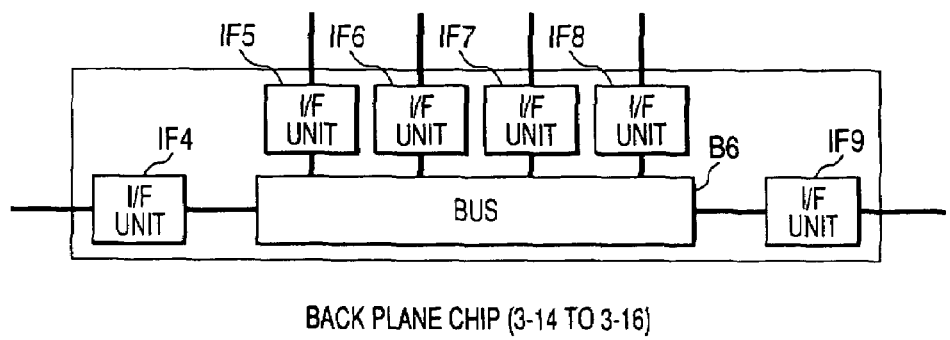
FIG. 6 is a diagram showing an example of a structure of a back plane chip.

FIG. 6 is a diagram showing an example of a structure of each of the back plane chips 3-14 to 3-16.

The back plane chip includes, for example, as shown in FIG. 6, interface units IF4 to IF9 and a bus B6.

The interface units IF4 to IF9 converts an electric signal outputted to the outside of the chip into a light signal and converts a light signal inputted from the outside of the chip into an electric signal.

The bus B6 functions as a relay device for performing data communication with the peripheral chip 3-13 or the like. The bus B6 is constituted by a cross bus switch or the like.

Figure 7:
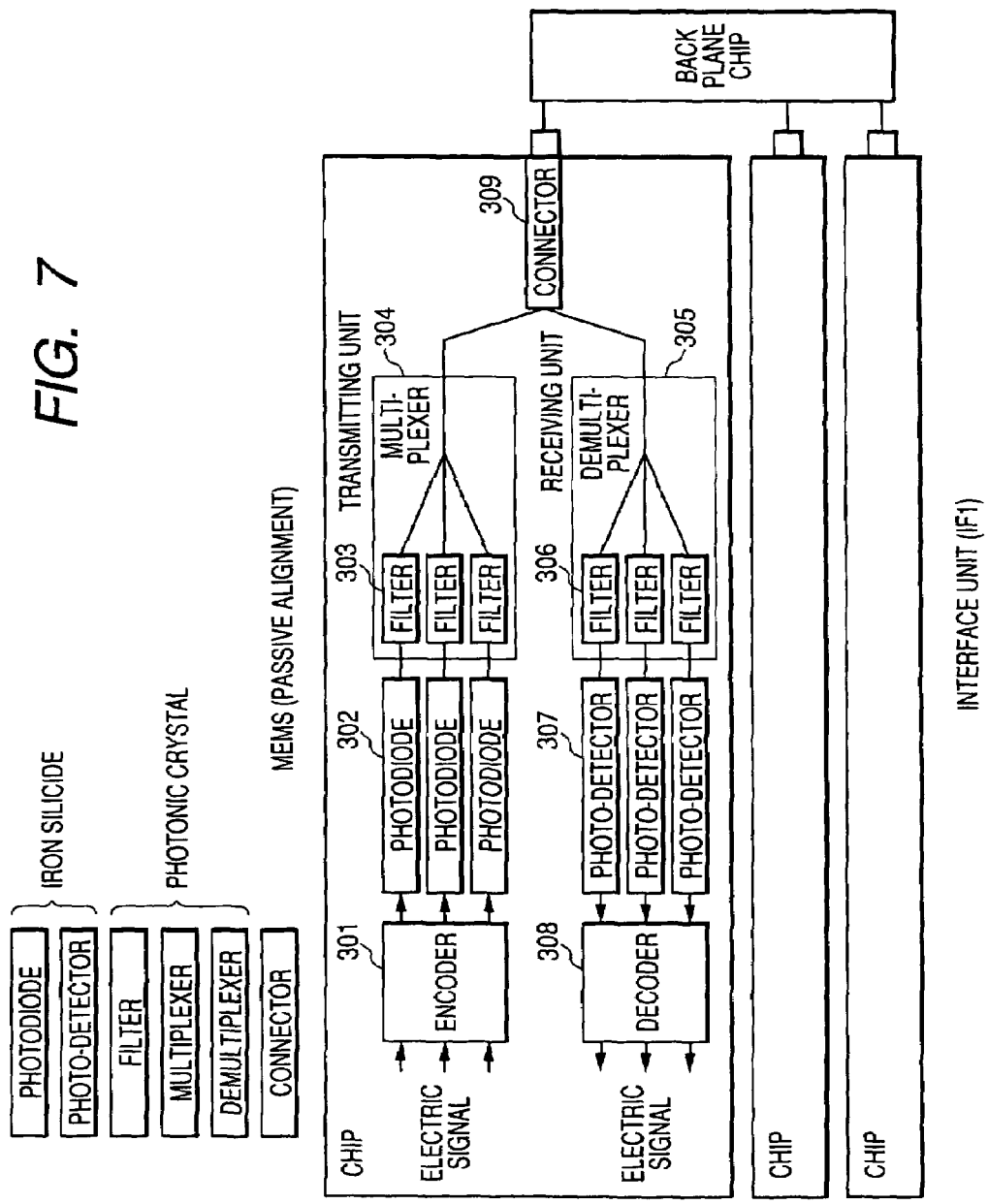
FIG. 7 is a diagram showing an example of a structure of an interface unit that performs conversion of an electric signal and an optical signal in the module array chip.

FIG. 7 is a diagram showing an example of a structure of the interface unit (IF1) that performs conversion of an electric signal and a light signal in the module array chips 3-1 to 3-8. The interface units (IF2 to IF9) included in the other chips have, for example, the same structure as the structure shown in FIG. 7.

The interface unit shown in FIG. 7 includes an encoder 301, plural photodiodes 302, a multiplexer 304, a connector 309, a demultiplexer 305, plural photo-detectors 307, and a decoder 308.

The encoder 301 applies predetermined encoding processing to parallel signals of the modules M inputted and outputted via the bus and outputs the parallel signals as serial signals. For example, in order to prevent an identical code from being continuously attached to a series of data, the encoder 301 encodes the serial signals according to, for example, a system called '64B/66B' and converts information of 64 bits into information of 66 bits.

The photodiodes 302 generate light signals corresponding to the serial signals outputted from the encoder 301. In the example in the figure, three photodiodes are shown. However, the number of photodiodes 302 is set according to the number of light signals multiplexed by the multiplexer 304. The photodiodes 302 are formed using, for example, iron silicide and generate light signals corresponding to electric signals at an extremely high through rate.

The multiplexer 304 includes plural filters 303 that separate light signals having specific wavelengths, respectively, from the light signals outputted from the plural photodiodes 302. The multiplexer 304 multiplexes the light signals of the respective wavelengths separated and outputs the light signals to the connector 309.

The connector 309 outputs the light signals multiplexed by the multiplexer 304 to the outside of the chip and outputs multiplexed light signals inputted from the outside of the chip to the demultiplexer 305. It is possible to accurately position the connector 309 according to a system such as passive alignment. The connector 309 is formed by, for example, an MEMES (micro electro mechanical system) technique.

The demultiplexer 305 includes plural filters 306 that separate light signals having specific wavelengths, respectively, from the multiplexed light signals inputted from the connector 309. The demultiplexer 305 inputs the signals of the respective wavelengths separated to the photo-detectors 307 corresponding to the filters 306.

The photo-detectors 307 generate electric signals corresponding to the light signals outputted from the demultiplexer 305. In the example in the figure, three photo-detectors 307 are shown. However, the number of photo-detectors 307 is set according to the number of light signals separated by the demultiplexer 304. The photo-detectors 307 are formed using, for example, iron silicide and generate electric signals corresponding to light signals at an extremely high through rate.

The decoder 308 applies predetermined decoding processing to the electric signals outputted from the plural photo-detectors 307 as serial signals and converts the serial signals into parallel signals inputted and outputted in the modules M. For example, the decoder 308 decodes the signals encoded according to '64B/66B' and converts the information of 66 bits into information of 64 bits.

According to the interface unit shown in FIG. 7, it is possible to transmit a signal among the chips at speed higher than transmission speed of a signal in the bus in the chip according to an extremely fast photoelectric conversion function.

When the number of signal lines of one module is set to 256, an operation frequency is set to 150 MHz, and signals for four modules are transmitted independently, transfer speed of the interface unit is, for example, 160 Gbps when encoding is performed by the encoder 301. The transfer speed is, for example, 38.4 Gbps when encoding is not performed. The multiplexer 304 is capable of realizing transfer speed of 160 Gbps by multiplexing light signals of sixty-four kinds of wavelengths having transfer speed of 2.5 Gbps, respectively, according to, for example, D-WDM (dense wavelength division multiplexing).

Figure 8A:
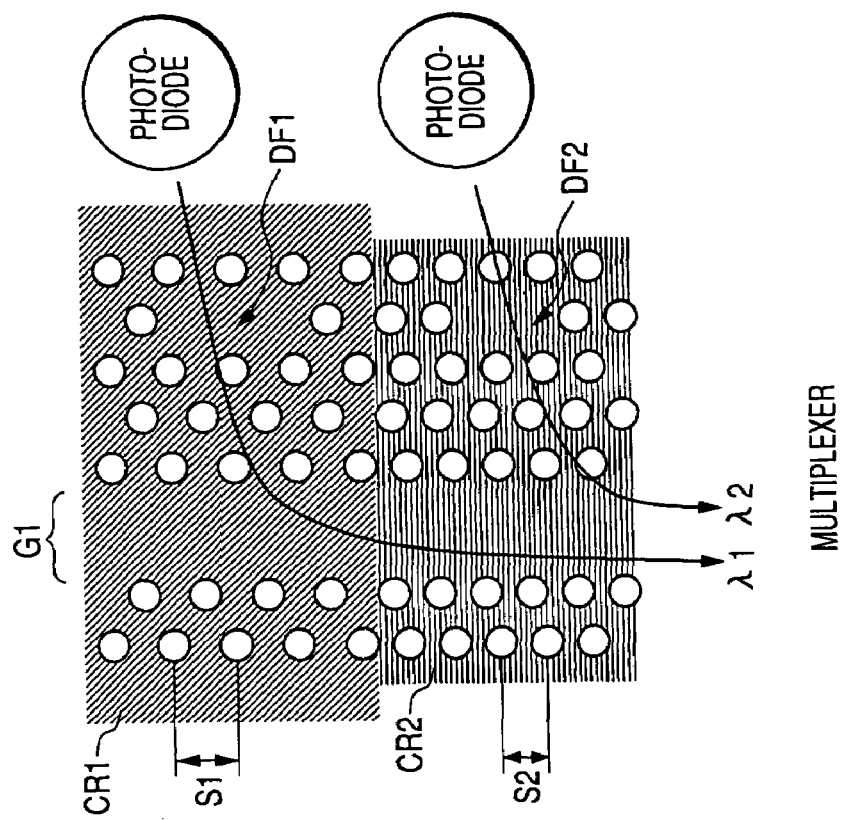
FIGS. 8A and 8B are diagrams showing examples of structures of a multiplexer and a demultiplexer in the interface unit shown in FIG. 7.
Figure 8B:
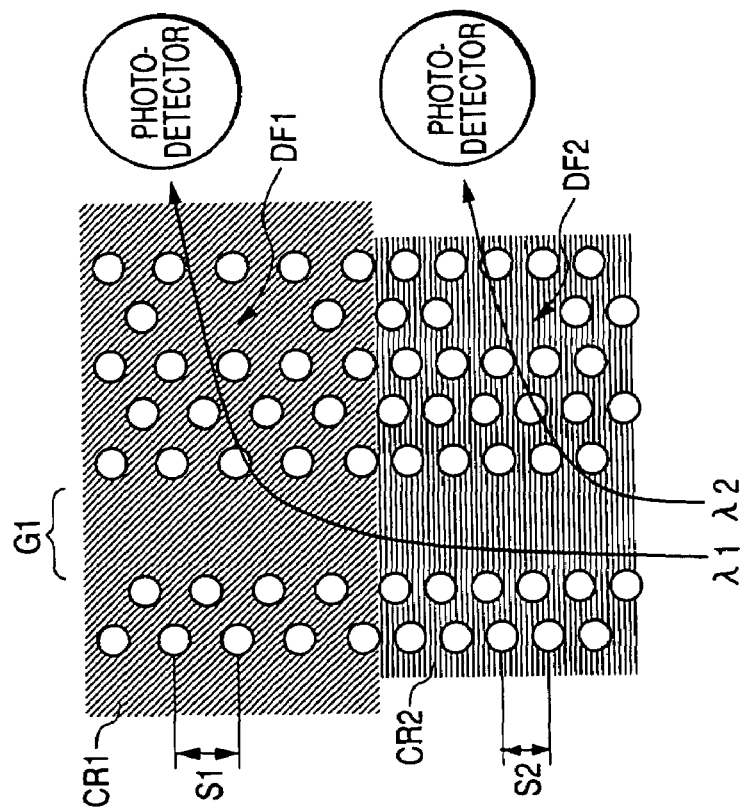

FIGS. 8A and 8B are diagrams showing examples of structures of the multiplexer 304 and the demultiplexer 305.

The multiplexer 304 and the demultiplexer 305 have, for example, an in-plane hetero-structure in which plural two-dimensional photonic crystals (CR1, CR2, . . . ) having different pitches are connected side by side.

In the in-plane hetero-structure, an optical waveguide G1 is provided to pierce through the photonic crystals having different pitches. Defects (DF1, DF2, . . . ) are provided for each crystal beside the optical waveguide G1. When a light signal is made incident on the optical waveguide G1, only lights of specific wavelengths ($\lambda 1, \lambda 2, \ldots$) are confined in the defects. When pitches of holes drilled in the photonic crystals are increased by 1.25 nm at a time, the wavelengths of the lights confined in the defects increase by, for example, 5 nm at a time.

The pitches of the photonic crystals in the in-plane hetero structure are set to proportionately change along a propagation direction of the lights (e.g., such that a ratio of pitches S1 and S2 shown in the figure are fixed in the photonic crystals adjacent to each other. When a distance between the optical waveguide and the defects is represented by the number of waves of the lights confined by the defects, a distance between the optical waveguide and the defects in the respective photonic crystals is fixed. Therefore, a Q value is fixed in light of any wavelength and a satisfactory filter characteristic is attained.

As shown in FIG. 8A, a demultiplexer that separates and outputs light of a specific wavelength included in a multiplexed light signal by outputting lights, which curve from the optical waveguide G1 to the defects (DF1, DF2, . . . ), to the photo-detectors is constituted.

As shown in FIG. 8B, a multiplexer that multiplexes lights of plural kinds of wavelengths by leading lights of specific wavelengths generated in the photodiodes to the optical waveguide G1 is constituted.

A section for realizing defect remedy for the modules M in the module array chip shown in FIG. 3 will be explained in detail.

Figure 9:
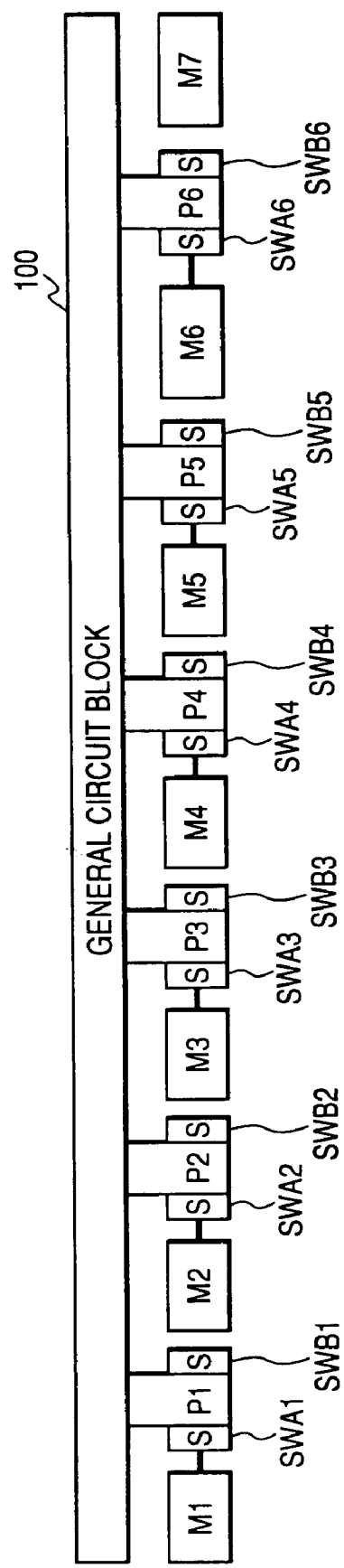
FIG. 9 is a diagram for explaining a section related to a defect remedial function in the module array chip.

FIG. 9 is a diagram for explaining a section related to a defect remedial function in the module array chip. For convenience of illustration, it is assumed that a total number of modules included in the module array chip is seven.

The module array chip shown in an example in FIG. 9 includes modules M1 to M7, a general circuit block 100, switch circuits SWA1 to SWA6, and switch circuits SWB1 to SWB6.

The modules M1 to M7 are examples of the module according to the embodiment of the invention.

The general circuit block 100 is an example of the circuit block according to the embodiment of the invention.

The circuit including the switch circuit SWA1 to SWA6 and SWB1 to SWB6 is an example of the module selecting unit according to the embodiment of the invention.

The modules M1 to M7 are formed as independent circuits that have predetermined functions, respectively, and the functions are substitutable for one another. All the modules M1 to M7 may have an identical circuit structure. If the functions are substitutable for one another, the modules M1 to M7 may include a module that has a different circuit structure in a part of the modules.

Circuit structures and functions of the modules M1 to M7 are arbitrary. The modules M1 to M7 may be circuits that have arithmetic operation and processing functions such as DSP (digital signal processors) or may be circuits that perform a relatively simple logical operation such as lookup tables.

Figure 10:
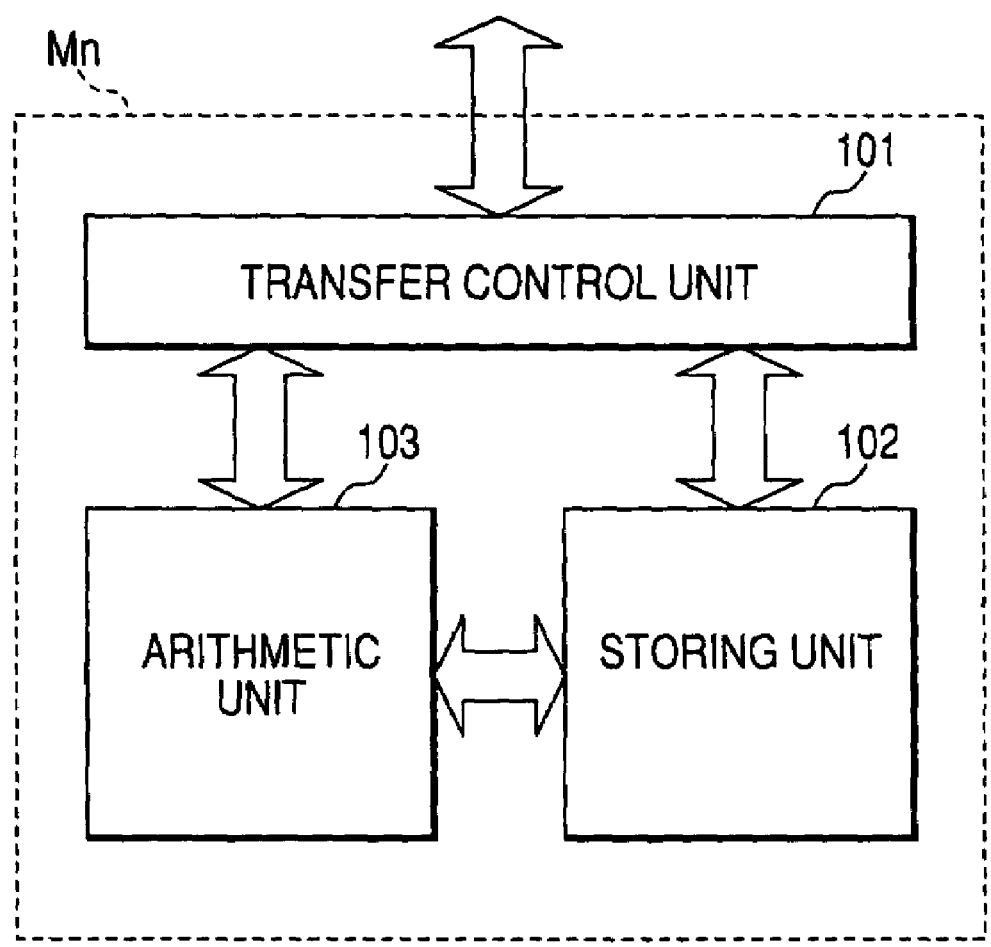
FIG. 10 is a diagram showing an example of a structure of a module.

FIG. 10 is a diagram showing an example of a structure of each of the modules M1 to M7. The module shown in FIG. 10 includes a transfer control unit 101, an arithmetic unit 103, and a storing unit 102.

The transfer control unit 101 controls transfer of data inputted and outputted via the bus Bp-q (p and q indicate integers from 1 to 4, respectively).

The arithmetic unit 103 executes an arithmetic operation corresponding to a command code stored in the storing unit 102. For example, an ALU (arithmetic logical unit) and a sequencer circuit are mounted on the arithmetic unit 103. The sequencer circuit controls the ALU according to the command code and executes various arithmetic operations.

The storing unit 102 stores command codes executed in the arithmetic unit 103, data used for processing of the arithmetic unit 103, data outputted from the arithmetic unit 103 as a result of the processing, and the like. The storing unit 102 temporarily stores data inputted and outputted in the transfer control unit 101.

The general circuit block 100 includes input/output units P1 to P6 for exchanging signals with the modules M1 to M7. The general circuit block 100 corresponds to a circuit block including the buses connected in layers (B1-1 to B1-4, B2-1 to B2-4, B3-1 to B3-4, and B4-1 to B4-4) in FIG. 3, the bus/interface unit IF1, and the like.

The input/output units P1 to P6 output at least one signal to one module among the modules M1 to M7 and/or input at least one signal generated in the one module.

All the input/output units P1 to P6 may input and output signals of an identical combination. An input/output unit of a different type that inputs and outputs signals of a different combination may be included in the input/output units P1 to P6.

For example, when the modules M1 to M7 include three output terminals, input/output units that input signals from all the three output terminals, an input/output unit that inputs a signal only from one of the output terminals, and the like may be mixed.

A switch circuit SWAi (i indicates integers from 1 to 6) is connected between an input/output unit Pi and a module Mi and is turned on and off in response to a control signal (not shown) inputted.

A switch circuit SWBi is connected between the input/output unit Pi and a module M(i+1) and is turned on and off in response to the control signal inputted.

The switch circuits SWA1 to SWA6 and SWB1 to SWB6 constitute module selecting units.

The module selecting units (SWA1 to SWA6 and SWB1 to SWB6) are circuits that have a function of selecting six modules out of the seven modules (M1 to M7) according to a control signal and connecting the six modules selected and the six input/output units (P1 to P6) in a one to one relation.

The module selecting units (SWA1 to SWA6 and SWB1 to SWB6) connect one module selected out of two modules according to a control signal to the respective six input/output units (P1 to P6). In other words, the module electing units select one of the module Mi and the module M(i+1) according to a control signal inputted and connect the module selected to the input/output unit Pi.

The module selecting units (SWA1 to SWA6 and SWB1 to SWB6) select six modules according to, for example, a control signal supplied from a not-shown control unit, such that a broken-down module among the seven modules (if no failure occurs, a module provided for redundancy in advance) is disconnected from all the input/output units.

For example, when a control signal instructing disconnection of a module Mn (n indicates integers from 1 to 7) from all the input/output units is inputted, if n is integers from 2 to 6 (i.e., the modules M2 to M6 are disconnected), the switch circuits SWA1 to SWA(n−1) are turned on, the switch circuits SWAn to SWA6 are turned off, the switch circuits SWB1 to SWB(n−1) are turned off, and the switch circuits SWBn to SWB6 are turned on.

If n is an integer 1 (i.e., the module M1 is disconnected), all the switch circuits SWA1 to SWA6 are turned off and all the switch circuits SWB1 to SWB6 are turned on.

If n is an integer 7 (i.e., the module M7 is disconnected), all the switch circuits SWA1 to SWA6 are turned on and all the switch circuit SWB1 to SWB6 are turned off.

Figure 11A:
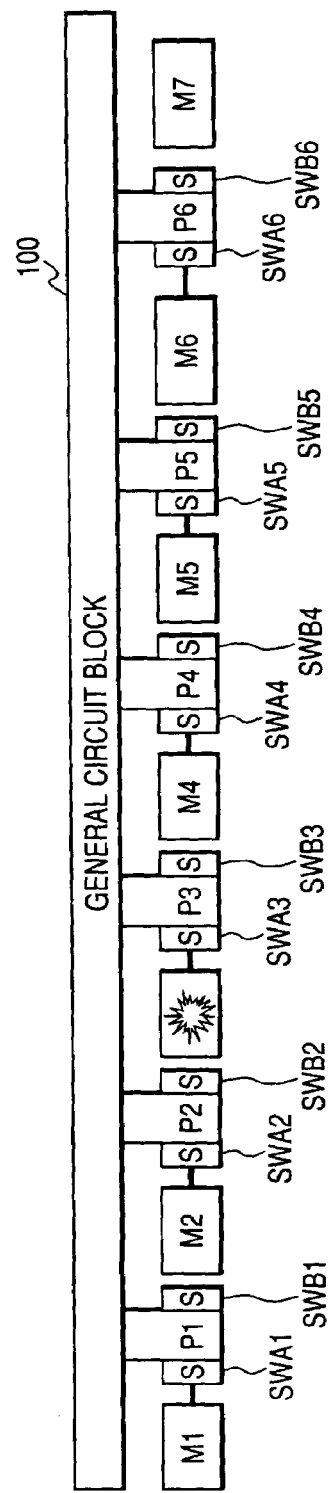
FIGS. 11A and 11B are diagrams showing example of a connection state of respective modules and respective input/output units in the case in which a defect occurs in a specific module.
Figure 11B:
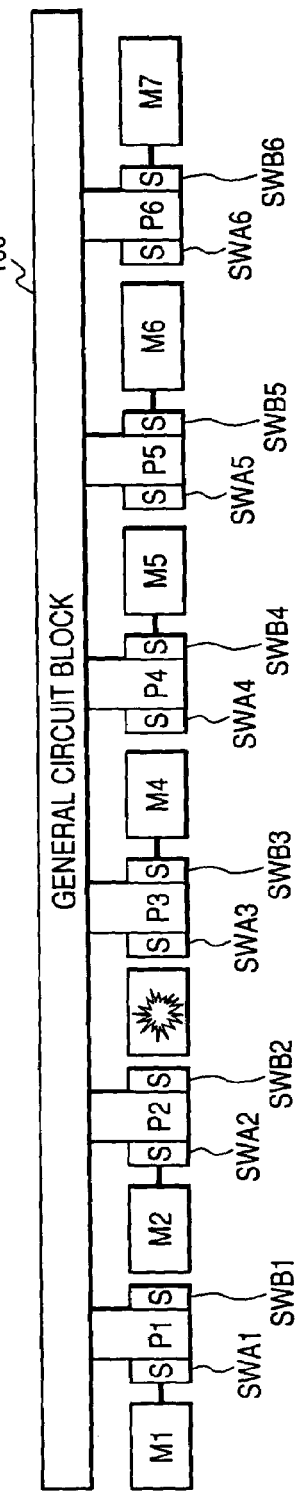

FIGS. 11A and 11B are diagrams showing a connection state in the case in which a defect occurs in the module M3. In this case, the not-shown control unit generates a control signal to disconnect the module M3 from all the input/output units.

In response to this control signal, the switch circuits SWA1 and SWA2 are turned on, the switch circuits SWA3, SWA4, SWA5, and SWA6 are turned off, the switch circuit SWB1 and SWB2 are turned off, and the switch circuit SWB3, SWB4, SWB5, and SWB6 are turned on.

Consequently, the input/output unit P1 and the module M1, the input/output unit P2 and the module M2, the input/output unit P3 and the module M4, the input/output unit P4 and the module M5, the input/output unit P5 and the module M6, and the input/output unit P6 and the module M7 are connected, respectively, and the module M3 is disconnected from the general circuit block 100.

Figure 12:
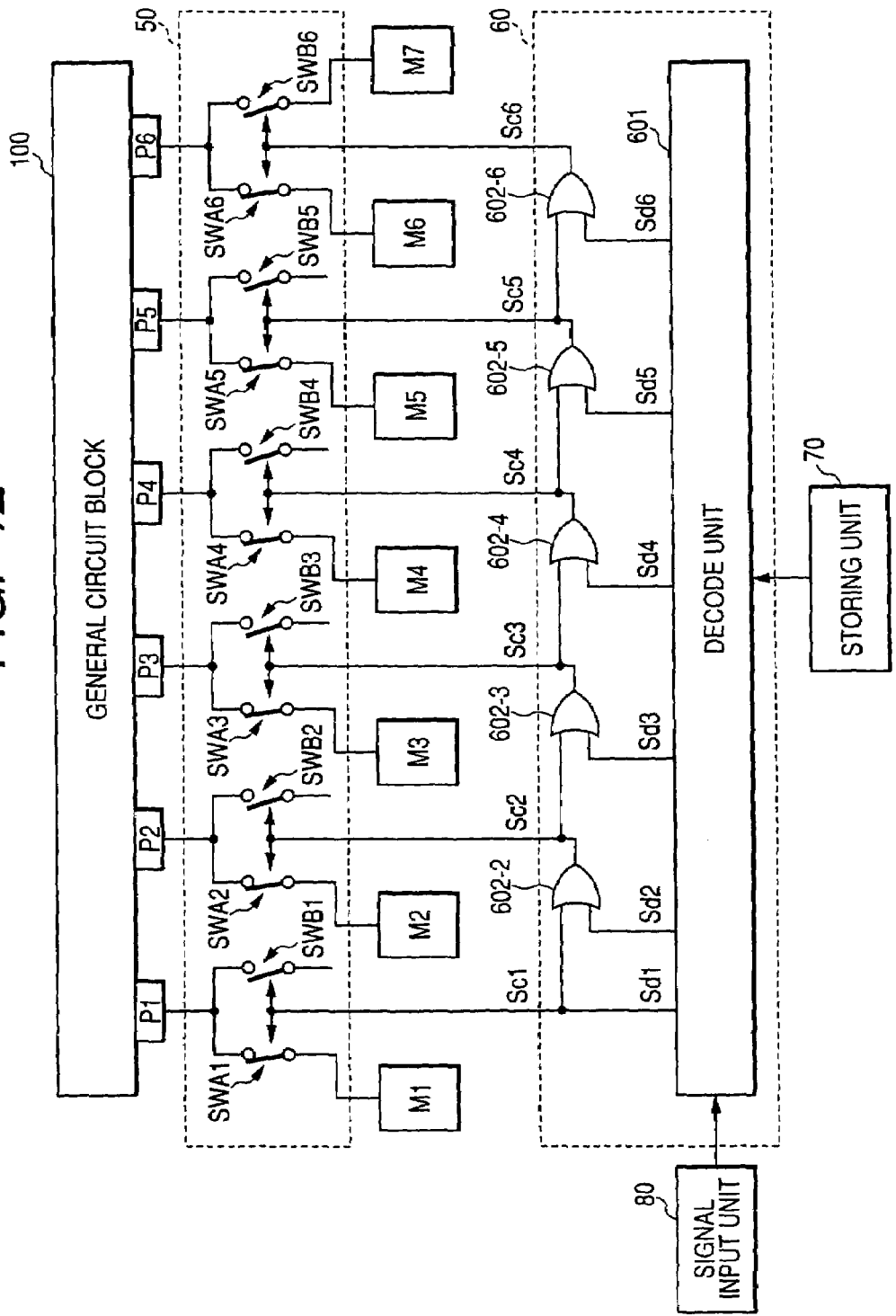
FIG. 12 is a diagram showing an example of a more detailed structure of the section related to the defect remedial function in the module array chip.

FIG. 12 is a diagram showing an example of a more detailed structure of a section related to the defect remedial function in a module array chip. Components identical with those in FIG. 9 are denoted by the identical reference numerals and signs. In the example in FIG. 12, for convenience of illustration, the number of modules included in the module array is set to seven.

The module array chip shown in FIG. 12 includes the modules M1 to M7, the general circuit block 100 including the input/output units P1 to P6, a module selecting unit 50, a control unit 60, a storing unit 70, and a signal input unit 80.

The module selecting unit 50 selects, according to a control signal supplied from the control unit 60, six modules out of the modules M1 to M7 and connects the six modules selected and the six input/output units P1 to P6 of the general circuit block 100 in a one to one relation.

The module selecting unit 50 includes, for example, as shown in FIG. 12, the switch circuits SWA1 to SWA6 and the switch circuits SWB1 to SWB6.

The switch circuit SWAi ($1 \leq i \leq 6$) is connected between the input/output unit Pi and the module Mi. When a control signal Sci supplied from the control unit 60 takes a value '0', the switch circuit SWAi is turned on and, when the control signal Sci takes a value '1', the switch circuit SWAi is turned off.

The switch circuit SWBi is connected between the input/output unit Pi and the module M(i+1). When the control signal Sci takes the value '0', the switch circuit SWBi is turned off and, when the control signal Sci takes the value '1', the switch circuit SWBi is turned on.

The switch circuit SWAi includes at least one circuit that turns on and off a signal transmitted from the input/output unit Pi to the module Mi and/or at least one circuit that turns on and off a signal transmitted from the module Mi to the input/output unit Pi.

Similarly, the switch circuit SWBi includes at least one circuit that turns on and off a signal transmitted from the input/output unit Pi to the module M(i+1) and/or at least one circuit that turns on and off a signal transmitted from the module M(i+1) to the input/output unit Pi.

The control unit 60 generates control signals Sc1 to Sc6 for controlling the module selecting unit 50. In a first operation mode, the control unit 60 generates the control signals Sc1 to Sc6 to disconnect one module, which is indicated by a signal inputted from the signal input unit 80, from all the input/output units (P1 to P6). In a second operation mode, the control unit 60 generates the control signals Sc1 to Sc6 to disconnect one module, which is indicated by information written in the storing unit 70, from all the input/output units (P1 to P6).

A method of recognition of an operation mode by the control unit 60 is arbitrary. For example, the control unit 60 may recognize the operation mode according to a signal applied to a predetermined terminal or may recognize the operation mode according to a value of a flag written in the storing unit 70.

The first operation mode is mainly set when an inspection of a module is performed. The second operation mode is set in a usual state after the inspection of the module is completed.

When it is instructed in the signal inputted from the signal input unit 80 or the information written in the storing unit 70 to disconnect the module Mn ($1 \leq n \leq 7$) from all the input/output units, the control unit 60 outputs the control signals Sc1 to Sc6 described below according to a value of the integer n.

[$2 \leq n \leq 6$]

In this case, the control unit 60 sets the control signals Sc1 to Sc(n−1) to the value '0' and sets the control signals Scn to Sc6 to the value '1'.

Consequently, the switch circuits SWA1 to SWA(n−1) are set to on, the switch circuits SWAn to SWA6 are set to off, the switch circuits SWB1 to SWB(n−1) are set to off, and the switch circuits SWBn to SWB6 are set to on. As a result, the modules M1 to M(n−1) are connected to the input/output units P1 to P(n−1) in a one to one relation, the modules M(n+1) to M7 are connected to the input/output units Pn to P6 in a one to one relation, and the module Mn is disconnected from all the input/output units.

[n=1]

In this case, the control unit 60 sets all the control signals Sc1 to Sc6 to the value '1'.

Consequently, all the switch circuits SWA1 to SWA6 are set to off and all the switch circuits SWB1 to SWB6 are set to on. As a result, the modules M2 to M7 are connected to the input/output units P1 to P6 in a one to one relation and the module M1 is disconnected from all the input/output units.

[n=7]

In this case, the control unit 60 sets all the control signals Sc1 to Sc6 to the value '0'.

Consequently, all the switch circuits SWA1 to SWA6 are set to on and all the switch circuits SWB1 to SWB6 are set to off. As a result, the modules M1 to M6 are connected to the input/output units P1 to P6 in a one to one relation and the module M7 is disconnected from all the input/output units.

The control unit 60 includes, for example, as shown in FIG. 12, a decode unit 601 and OR circuits 602-2 to 602-6.

The decode unit 601 decodes information stored in the storing unit 70 or a signal inputted from the signal input unit 80 and outputs a result of the decoding as signals Sd1 to Sd6.

When the information stored in the storing unit 70 or the signal inputted from the signal input unit 80 instructs disconnection of the module Mn from all the input/output units, the decode unit 601 generates the signals Sd1 to Sd6 described below.

If 'n' is integers from 1 to 6, the decode unit 601 sets a signal Sdn to '1' and sets other signals to '0'.

If 'n' is an integer 7, the decode unit 601 sets all the signals Sd1 to Sd6 to the value '0'.

Since the signals Sd1 to Sd6 are signals that instruct whether the respective modules M1 to M7 should be disconnected from all the input/output units, the signals are referred to as instruction signals Sd1 to Sd6 in the following description.

In the first operation mode (the operation mode at the time of a module inspection), the decode unit 601 generates the instruction signals Sd1 to Sd6 according to the signal inputted from the signal input unit 80. In the second operation mode (the operation mode after completion of the module inspection), the decode unit 601 generates the instruction signals Sd1 to Sd6 according to the information written in the storing unit 70.

In the example in FIG. 12, the instruction signal Sd1 outputted by the decode unit 601 is the same as the control signal Sc1 supplied to the module selecting unit 50.

The OR circuits 602-2 to 602-6 are OR operation circuits, each of which has two inputs and one output. The OR circuits 602-2 to 602-6 are connected in cascade in this order.

The OR circuit 602-2 inputs the instruction signal Sd1 (i.e., the control signal Sc1) to one of the two inputs and inputs the instruction signal Sd2 to the other. An output of the OR circuit 602-2 is supplied to the module selecting unit 50 as the control signal Sc2.

An OR circuit 602-$k$ ($k$ indicates integers from 3 to 6) inputs an output signal of an OR circuit 602-($k$−1) to one of the two inputs and inputs an instruction signal Sd$k$ to the other. An output of the OR circuit 602-$k$ is supplied to the module selecting unit 50 as a control signal Sc$k$.

When an instruction signal Sdj (j indicates integers from 2 to 6) takes the value '1', an OR circuit 602-$j$, to which the instruction signal Sdj is inputted, outputs a control signal Scj of the value '1'. When 'j' is smaller than 6, all control signals Sc(j+1) to Sc6 outputted from OR circuits 602-($j$+1) to 602-6 at stages later than the OR circuit 602-$j$ also take the value '1'.

When the instruction signal Sd1 (i.e., the control signal Sc1) of the decode unit 601 takes the value '1', the OR circuit 602-2, to which the instruction signal Sd1 is inputted, outputs the control signal Sc2 of the value '1'. All control signals Sc3 to Sc6 outputted from the OR circuits 602-3 to 602-6 at stages later than the OR circuit 602-2 also take the value '1'.

On the other hand, when all the instruction signals (Sd1 to Sd6) of the decode unit 601 takes the value '0', all input and output signals of the OR circuits 602-2 to 602-6 take the value '0', all the control signals (Sc1 to Sc6) supplied to the module selecting unit 50 take the value '0'.

Therefore, in disconnecting the module Mn from all the input/output units, when 'n' is integers from 2 to 6, the decode unit 601 sets the instruction signals Sd1 to Sd(n−1) to the value '0', sets the instruction signal Sdn to the value '1', and sets the instruction signals Sd(n+1) to Sd6 to the value '0'. Thus, the control signals Sc1 to Sc(n−1) take the value '0' and the control signals Scn to Sc6 take the value '1'. When 'n' is an integer 1, since the decode unit 601 sets the instruction signal Sd1 to the value '1', all the control signals Sc1 to Sc6 take the value '1'. When 'n' is an integer 7, since the decode unit 601 sets all the instruction signals Sd1 to Sd6 to the value '0', all the control signals Sc1 to Sc6 take the value '0'.

The storing unit 70 stores information indicating one module that should be disconnected from all the input/output units (P1 to P6) among the seven modules (M1 to M7).

It is possible to constitute the storing unit 70 with a fuse element, a nonvolatile memory, or the like.

The signal input unit 80 is a circuit for inputting a signal indicating one module that should be disconnected from all the input/output units (P1 to P6). The signal input unit 80 is used for inputting a signal from an external apparatus to the control unit 60, for example, when a module array chip is inspected.

The module array chips shown in FIGS. 9 and 12 include only one redundant module. Thus, it is difficult to remedy two or more defects. When a probability of occurrence of defects is high, it is likely that it is difficult to attain sufficient yield unless the number of remediable defects is increased.

Thus, plural sets of modules (module blocks) capable of remedying one defect may be provided in the module array chips as shown in FIGS. 9 and 12.

Figure 13:
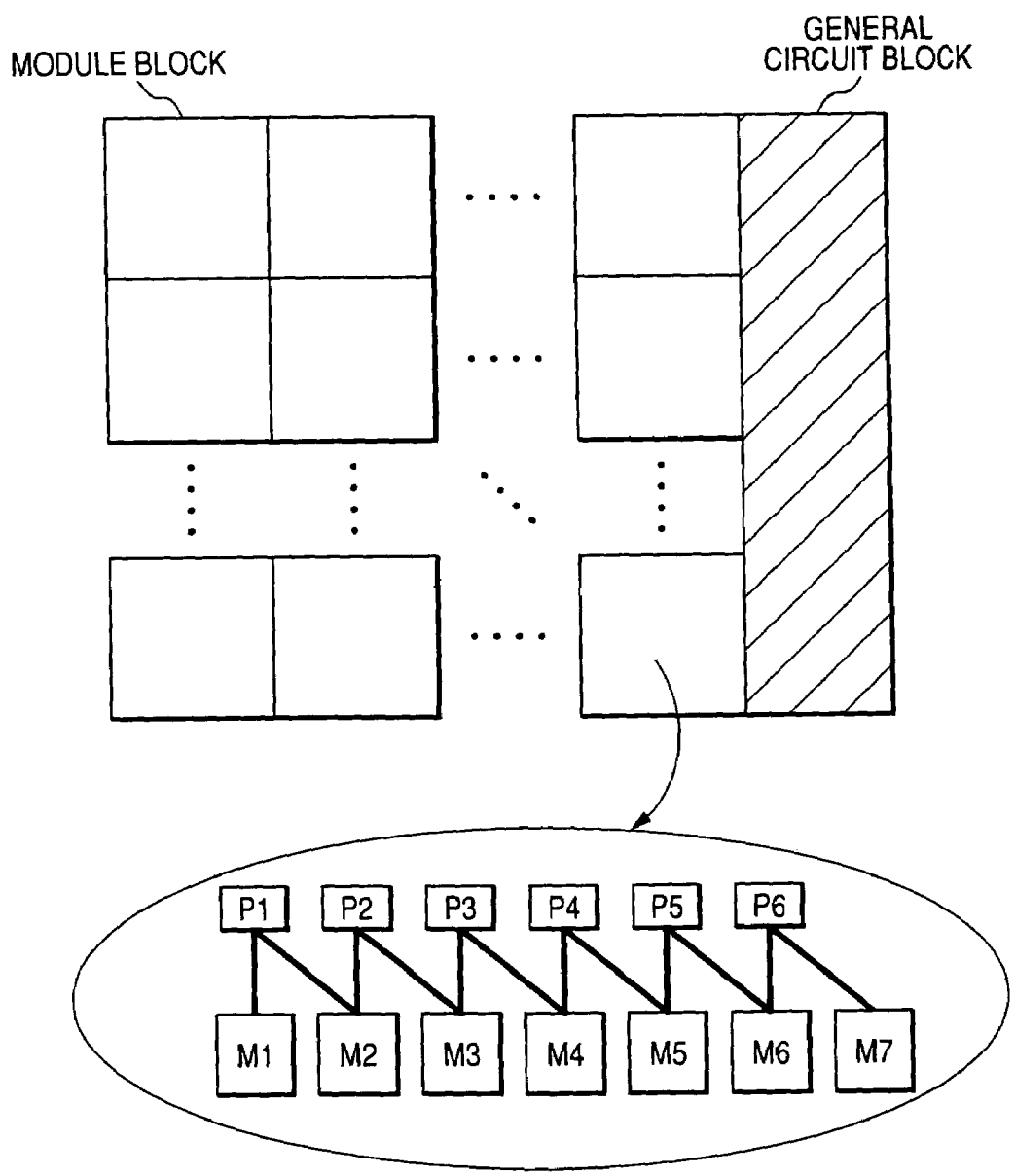
FIG. 13 is a diagram showing an example of a module array chip that has plural module blocks.

FIG. 13 is a diagram showing an example of a module array chip that includes plural module blocks.

In each of the module blocks, N (N indicates an integer larger than 2) modules, functions of which are substitutable for one another, and a module selecting unit that selects (N−1) modules from the N modules and connects the (N−1) modules to (N−1) input/output units of the general circuit block 100 are provided.

The module blocks may be arranged regularly as shown in FIG. 13 or may be arranged in an area of a free shape.

It is possible to remedy a larger number of defects in the module chip array by providing the plural module blocks and the module selecting unit.

An example of application of the circuit device according to this embodiment will be explained.

Figure 14:
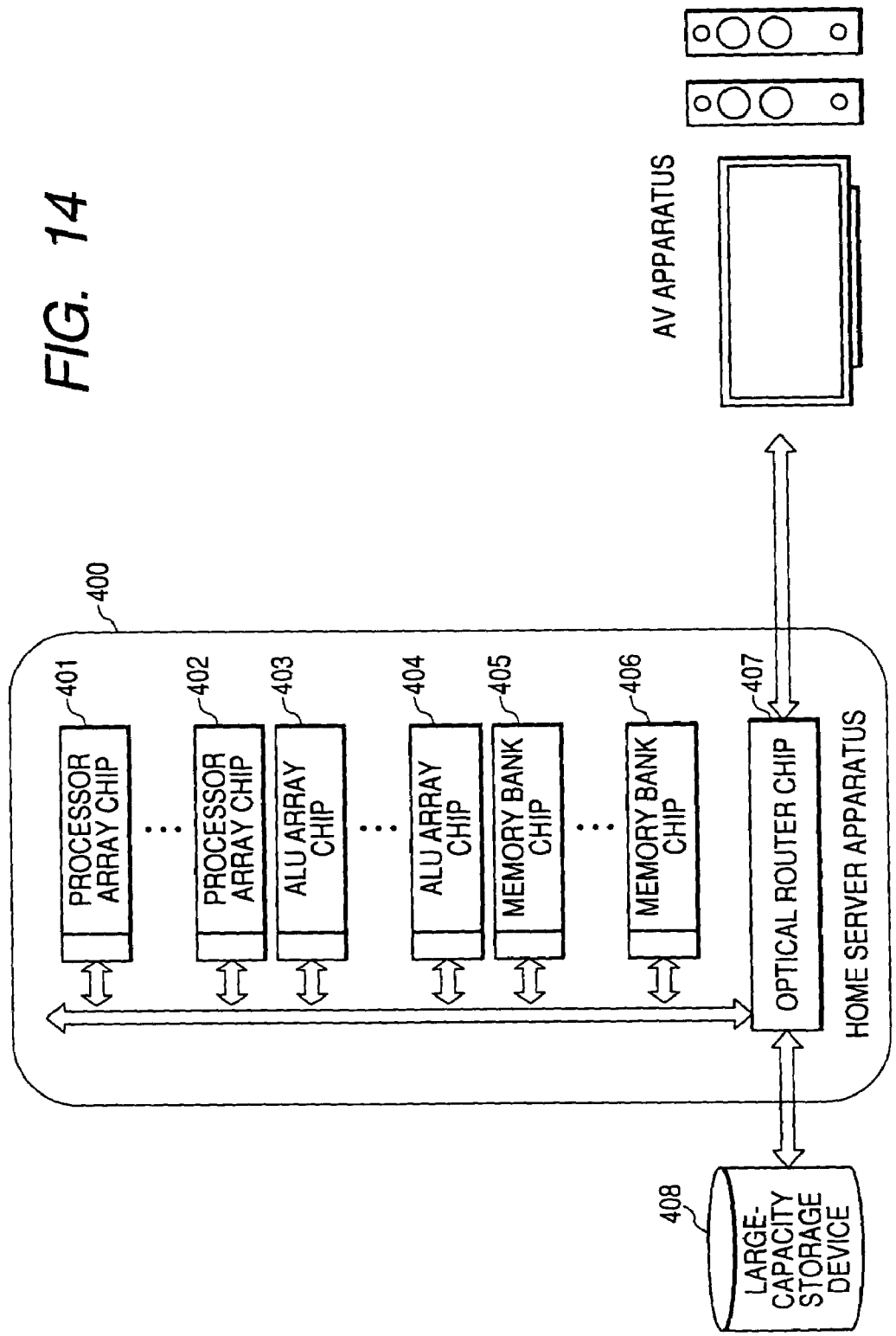
FIG. 14 is a diagram showing an example in which the circuit device according to the embodiment is applied to a home server apparatus.

FIG. 14 is a diagram showing an example in which the circuit device according to this embodiment is applied to a home server apparatus. In the home server apparatus, various electronic apparatuses (an AV apparatus, a personal computer, a game machine, and the like) in the home are connected by a network to store and manage information.

A home server apparatus 400 shown in FIG. 14 includes processor array chips 401 to 402 including plural processor modules, ALU (arithmetic and logical unit) array units 403 to 404 including plural ALU modules, memory bank array units 405 to 406 including plural memory banks, and an optical router chip 407.

These chips are constituted on, for example, a common circuit board. The chips are mounted with the same interface units as those in the embodiment, respectively, and communicate with each other via an optical fiber or the like.

The processor array chips 401 to 402 execute general-purpose processing. The ALU array units 403 to 404 execute arithmetic processing.

The optical router chip 407 communicates with an external large-capacity storage device 408 and an external AV (audio video) apparatus capable of performing optical digital connection. The optical router chip 407 also performs processing for routing information of audio, video, and the like processed by the processor array chips 401 to 402, the ALU array units 403 to 404, and the memory bank array units 405 to 406 to external apparatuses.

The memory bank array units 405 to 406 temporarily stores information read and written by the external large-capacity storage device 408. Consequently, transfer speed and access time of the large-capacity storage device 408 are concealed as much as possible to realize high-speed and comfortable data processing.

Since all the chips have the redundant remedial function, it is possible to manufacture them at high yield. Since the chips are constituted by standard components, they are excellent in extensibility of a system. Moreover, since the external AV apparatus is connected by an optical interface, it is less affected by signal processing noise.

As explained above, in the circuit device according to this embodiment, plural kinds of modules, functions of which are not substitutable for one another, are included in all plural semiconductor circuit devices formed on independent chips, respectively, and modules of an identical type are included in semiconductor circuit devices on an identical substrate. The plural semiconductor circuit devices communicate with each other to realize operations of the entire circuit device.

When the plural kinds of modules are used as a whole, it is possible to simplify a manufacturing process and improve productivity by collecting modules of an identical type in the semiconductor circuit devices on an identical chip. Since it is possible to reduce complicated design work necessary to combining different types of modules, it is possible to reduce burdens of redesigning. Moreover, since connection and disconnection are possible by a unit of a chip, extensibility of the system is improved and it is possible to prepare a variety of systems using less kinds of components.

In the circuit device according to this embodiment, among the plural modules included in the semiconductor circuit devices on the identical chips, usable modules, which are a part of the plural modules, selected by the module selecting unit exchange signals with the semiconductor circuit devices of the other chips through the interface unit.

This makes it possible to select and use normal modules excluding defective modules among the plural modules of the identical type included in the semiconductor circuit devices on the identical chip. Thus, it is possible to solve a fall in yield due to defects of the modules. Even if defect remedy is performed in a semiconductor circuit device of a certain chip, operations of the other chips are not affected. Thus, it is possible to provide the redundant remedial function in all the chips in the system.

In the circuit device according to this embodiment, a memory having the redundant remedial function for replacing a defective memory cell with a redundant memory cell is formed on an independent chip separate from the other module array chips. This makes it possible to manufacture a logic circuit and a memory in optimum processes different from each other. Thus, it is possible to improve performance of the logic circuit and the memory and realize a reduction in cost.

Moreover, in the circuit device according to this embodiment, the chips are connected by a signal transmitting unit in a band wider than that of inter-block communication in the chips. Thus, even if functional modules aggregated in one chip originally are arranged over plural chips, it is possible to minimize deterioration in performance.

Moreover, an optical interface unit is mixed in the chip in which logical functions are aggregated. This allows to reduce it packaging cost for the chips.

It is possible to manufacture a general-purpose chip by adopting a common communication system for the interface units in the respective chips. Thus, it is possible to reduce sections to be redesigned.

The embodiment of the invention has been explained. However, the invention is not limited to the embodiment and various modifications of the embodiment are possible.

In the embodiment, inter-chip communication is performed using light. However, the invention is not limited to this.

Figure 15:
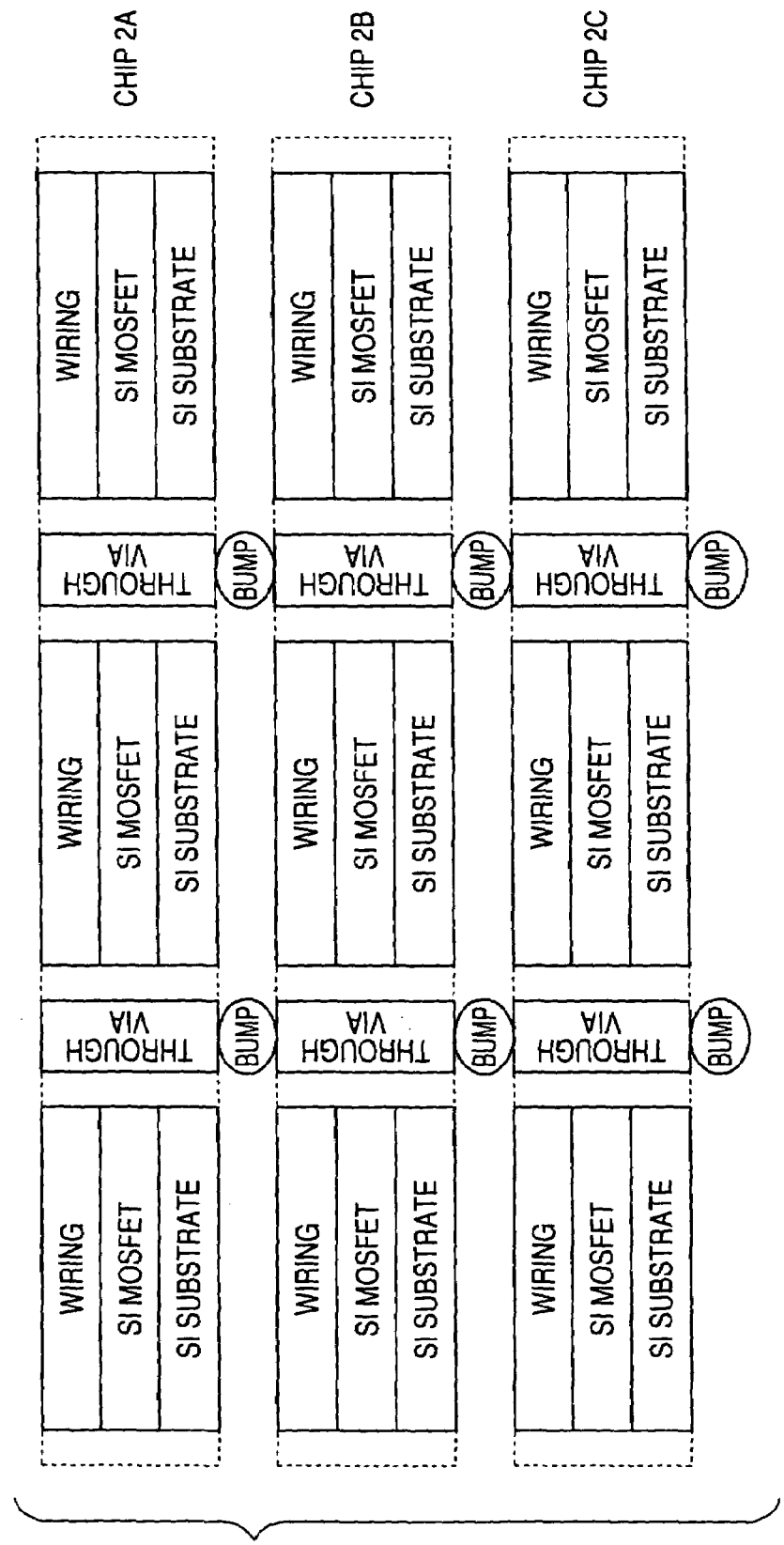
FIG. 15 is a diagram for explaining an example in which a through electrode is used for inter-chip communication.

FIG. 15 is a diagram for explaining an example in which a through electrode is used in inter-chip communication.

In recent years, according to the progress in the machining technology for semiconductors, it is possible to form a fine through electrode (also called as through via) in a semiconductor substrate machined extremely thin. When the through electrode is used, since it is possible to electrically connect chips in an extremely short distance, it is possible to perform high-speed inter-chip communication that is in no way inferior to communication in a chip.

In the example in FIG. 15, MOS transistors and wiring are formed on a silicon substrate and via electrodes piercing through chips in a vertical direction are formed to avoid the MOS transistors. For connection of vias among the chips (2A, 2B, and 2C), for example, bumps are used.

Figure 16:
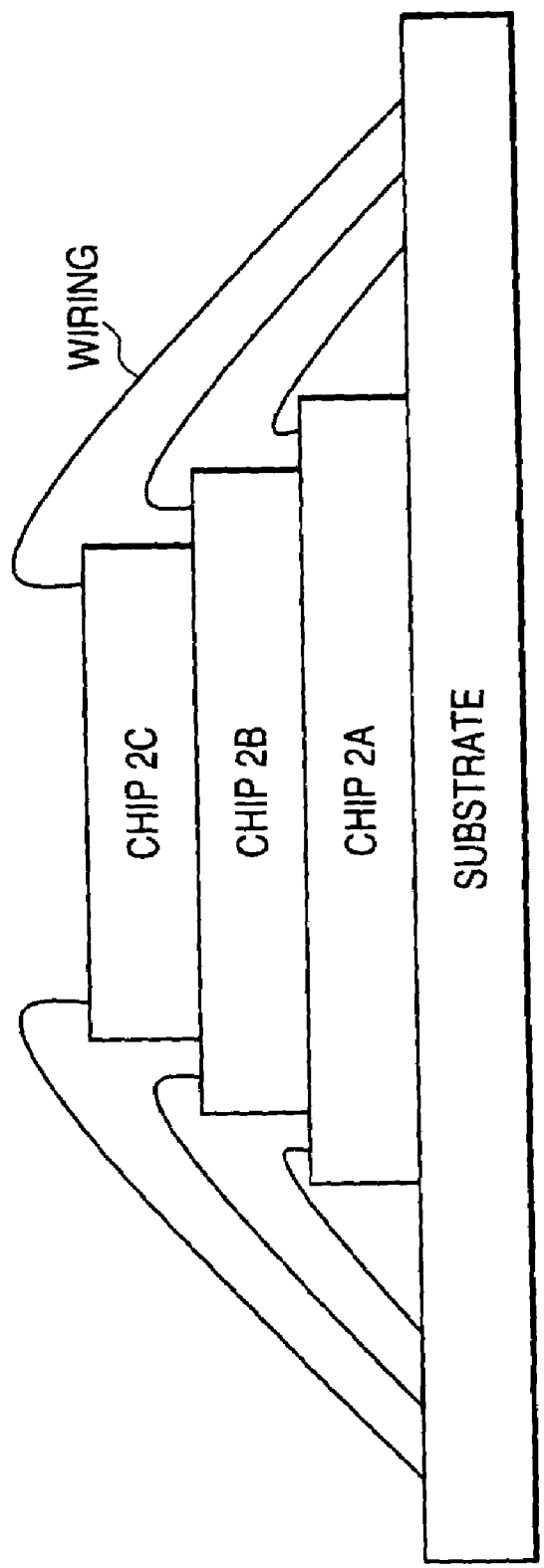
FIG. 16 is a diagram for explaining an example in which wiring by wire bonding is used for inter-chip communication.

FIG. 16 is a diagram for explaining an example in which wiring by wire bonding is used for inter-chip communication.

For example, as shown in FIG. 16, plural chips (2A, 2B, and 2C) are stacked on a substrate and the respective chips and the substrate are connected by wire bonding. It is difficult to perform high-speed communication using the wiring by wire bonding compared with optical communication and a through electrode. However, since it is possible to form the wiring by wire bonding using the existing manufacturing apparatus as it is, it is possible to realize the wiring by wire bonding at low cost compared with these systems.

Figure 17:
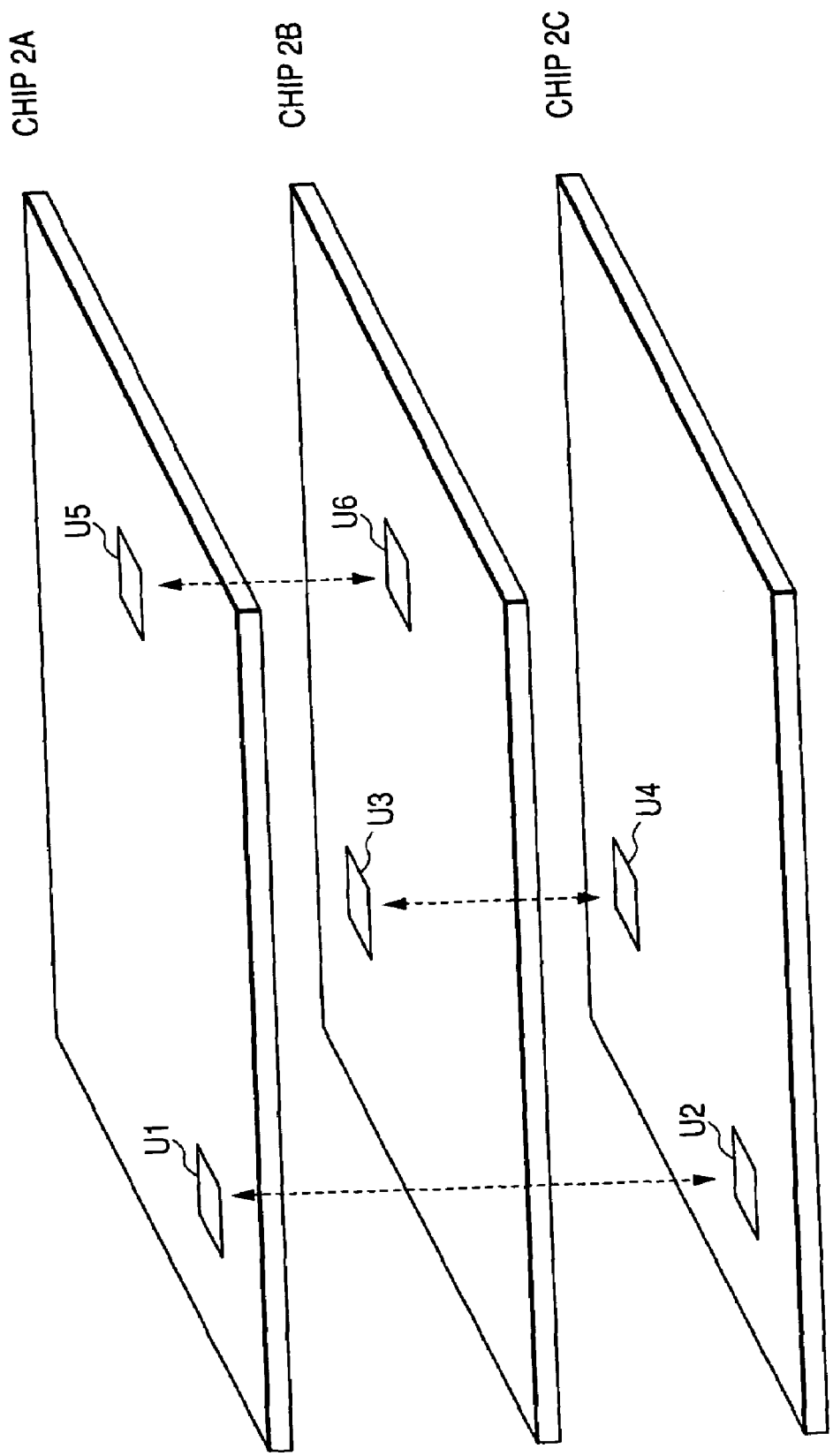
FIG. 17 is a diagram for explaining an example in which inter-chip communication is performed by radio.

FIG. 17 is a diagram for explaining an example in which inter-chip communication is performed by radio.

For example, as an interface unit for performing inter-chip communication, transmission and reception circuits for performing radio communication are formed on chips. The respective transmission and reception circuits are arranged such that antennas of the transmission and reception circuits for performing radio communication are opposed to one another when the chips are laid one on top of another.

In the example in FIG. 17, transmission and reception circuits U1 and U5 are arranged on a chip 2A, transmission and reception circuits U3 and U6 are arranged on a chip 2B, and transmission and reception circuits U2 and U4 are formed on a chip 2C. When the chips 2A, 2B, and 2C are laid on top of another and arranged in this order, the transmission and reception circuit U1 of the chip 2A and the transmission and reception circuit U2 of the chip 2C, the transmission and reception circuit U3 of the chip 2B and the transmission and reception circuit U4 of the chip 2C, and the transmission and reception circuit U5 of the chip 1A and the transmission and reception circuit U6 of the chip 2B are opposed to each other, respectively. Since the transmission and reception circuits opposed to each other are close to each other at a distance of about thickness of the chips, it is possible to perform high-speed communication with relatively low power.

As described above, means for realizing inter-chip communication is not limited to one. Thus, it is possible to select optimum means taking into account tradeoff of cost and performance.

The numerical values (the number of modules, the number of input/output units, the number of module blocks, etc.) specifically described in the embodiment are only examples. It is possible to appropriately change the numerical values to arbitrary numerical values.

According to an embodiment of the invention, it is possible to simplify a manufacturing process and reduce burdens of redesign by collecting modules of an identical type in semiconductor circuit devices on an identical substrate. It is possible to solve a fall in yield due to defects by selecting and using normal modules excluding defective modules among plural modules of an identical type included in semiconductor circuit devices on an identical substrate.

It should be understood by those skilled in the art that various modifications, combinations, sub-combinations, and alterations may occur depending on design requirements and other factors insofar as they are within the scope of the appended claims or the equivalents thereof.

What is claimed is:

1. A circuit device comprising plural semiconductor circuit devices that are formed on independent substrates, respectively, and communicate with each other, wherein
each of the semiconductor circuit devices includes:
plural modules of an identical type, functions of which are substitutable for one another;
a module selecting unit that selects, among the plural modules, usable modules that are a part of the plural modules; and
a circuit block including an interface unit for the modules selected by the module selecting unit to exchange signals with the other semiconductor circuit devices, and
a logic module included in one of the semiconductor circuit devices belongs to a different type, a function of which is not substitutable for a function of a logic module included in at least one of the other semiconductor circuit devices.

2. The circuit device according to claim 1, wherein
the circuit block has plural input/output units, each of which outputs at least one signal to one module and/or inputs at least one signal generated in the one module, and
the module selecting unit selects modules out of the plural modules according to a control signal inputted, connects the modules selected and the plural input/output units in a one to one relation, arid connects one module selected out of at least two modules according to the control signal to each of the plural input/output units.

3. The circuit device according to claim 1, wherein each of the plural semiconductor circuit devices has plural memory cells including a redundant memory cell and includes a semiconductor storage device for replacing a defective memory cell with the redundant memory cell.

4. The circuit device according to claim 1, further comprising a signal transmitting unit that is capable of transmitting signals among the semiconductor circuit devices at speed equivalent to or higher than transmission speed of signals among the modules in the semiconductor circuit device.

5. The circuit device according to claim 1, wherein two or more interface units included in different semiconductor circuit devices perform radio communication using radio waves.

6. The circuit device according to claim 1, wherein plural interface units included in the plural semiconductor circuit devices perform communication according to a common communication system.

7. The circuit device according to claim 1, further comprising a signal transmitting unit that is capable of transmitting signals among the semiconductor circuit devices at speed equivalent to or higher than transmission speed of signals within the semiconductor circuit devices.

8. The circuit device according to claim 2, wherein
the plural modules include N (N indicates an integer equal to or larger than 3) modules from a first module to an Nth module,
the plural input/output units include (N−1) input/output units from a first input/output unit to an (N−1)th input/output unit, and
the module selecting unit selects one of an i-th module (i indicates integers from 1 to (N−1)) and an (i+1)th module and connects the module selected to an i-th input/output unit.

9. The circuit device according to claim 2, wherein the plural modules include N (N indicates an integer equal to or larger than 3) modules from a first module to an Nth module,
the plural inputloutput units include (N−1) input/output units from a first input/output unit to an (N−1)th input/output unit, and
if a defect is detected in the i-th module (i indicates integers from 1 to (N−1)) the module selecting unit connects the first though (i−1)th modules to the first though (i−1)th input/output units, respectively, and connects the (i+1)th through N-th modules to the i-th through (N−1)th input/output modules, respectively.

10. The circuit device according to claim 4, wherein the signal transmitting unit transmits at least a part of signals using light.

11. The circuit device according to claim 4, wherein the signal transmitting unit includes an electrode that pierces through the substrate.

12. The circuit device according to claim 4, wherein the signal transmitting unit includes wiring formed by wire bonding.

13. The circuit device according to claim 10, wherein the interface unit converts at least a part of electric signals outputted to the signal transmitting unit into a light signal and convert at least a part of light signals inputted from the signal transmitting unit into an electric signal.

* * * * *

UNITED STATES PATENT AND TRADEMARK OFFICE
CERTIFICATE OF CORRECTION

PATENT NO. : 7,327,581 B2  
APPLICATION NO. : 11/593602  
DATED : February 5, 2008  
INVENTOR(S) : Mutsuhiro Ohmori Page 1 of 1

It is certified that error appears in the above-identified patent and that said Letters Patent is hereby corrected as shown below:

Column 17, Line 55:
"arid" should read -- and --.

Column 18, Line 36:
"inputloutput" should read -- input/output --.

Column 18, Line 41:
"though" should read -- through --.

Column 18, Line 42:
"though" should read -- through --.

Signed and Sealed this

Tenth Day of June, 2008

JON W. DUDAS  
*Director of the United States Patent and Trademark Office*